United States Patent
Goto

(10) Patent No.: US 8,143,707 B2
(45) Date of Patent: Mar. 27, 2012

(54) SEMICONDUCTOR DEVICE

(75) Inventor: Yoshiaki Goto, Aichi-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 39 days.

(21) Appl. No.: 12/641,865

(22) Filed: Dec. 18, 2009

(65) Prior Publication Data

US 2010/0164080 A1 Jul. 1, 2010

(30) Foreign Application Priority Data

Dec. 26, 2008 (JP) ................................ P2008-335305

(51) Int. Cl.
*H01L 23/495* (2006.01)
(52) U.S. Cl. ........ 257/666; 257/667; 257/668; 257/669; 257/670; 257/671; 257/672; 257/673; 257/674; 257/675; 257/676; 257/E23.039
(58) Field of Classification Search .......... 257/666–676, 257/E23.039
See application file for complete search history.

(56) References Cited

U.S. PATENT DOCUMENTS

| 6,087,722 | A  | * | 7/2000  | Lee et al. ..................... 257/723 |
| 6,118,184 | A  |   | 9/2000  | Ishio et al. |
| 2001/0031513 | A1 | * | 10/2001 | Masuda et al. ................. 438/107 |
| 2002/0014686 | A1 | * | 2/2002  | Kanemoto et al. ............. 257/678 |
| 2002/0121680 | A1 | * | 9/2002  | Ahn et al. ..................... 257/666 |
| 2009/0001530 | A1 |   | 1/2009  | Goto |
| 2009/0096073 | A1 |   | 4/2009  | Goto |

FOREIGN PATENT DOCUMENTS

| JP | 11-40738 | 2/1999 |
| JP | 2001-144247 | 5/2001 |

* cited by examiner

*Primary Examiner* — Steven Loke
*Assistant Examiner* — Kimberly M Thomas
(74) *Attorney, Agent, or Firm* — Oblon, Spivak, McClelland, Maier & Neustadt, L.L.P.

(57) ABSTRACT

A semiconductor device includes a circuit base including an inner lead portion and an outer lead portion. The inner lead portion has a plurality of inner leads. At least part of the inner leads is routed inside a chip mounting area. On both upper and lower surfaces of the circuit base, a first and a second semiconductor chip are mounted. At least part of electrode pads of the first semiconductor chip are electrically connected to electrode pads of the second semiconductor chip via the inner leads.

10 Claims, 14 Drawing Sheets

SEMICONDUCTOR DEVICE

CROSS-REFERENCE TO RELATED APPLICATIONS

This application is based upon and claims the benefit of priority from the prior Japanese Patent Application No. 2008-335305, filed on Dec. 26, 2008; the entire contents of which are incorporated herein by reference.

BACKGROUND OF THE INVENTION

In order to realize the downsizing and higher-density assembly of a semiconductor device, a semiconductor package having a plurality of semiconductor chips sealed in one package has been in practical use. When a cost reduction or the like of a semiconductor package is given higher priority, a lead frame is used as a circuit base on which semiconductor chips are mounted. In a semiconductor package using a lead frame (TSOP or the like), a plurality of semiconductor chips are stacked in order on the lead frame. Electrode pads of the semiconductor chips are electrically connected to inner leads of the lead frame via metal wires.

When a plurality of semiconductor chips different in size are mounted in a stacked manner on one surface (for example, a rear surface) of a lead frame, inner leads cannot be led to the vicinity of electrode pads of the upper small chip due to the shape of the lower large chip. This makes it difficult to connect the electrode pads of the upper small chip and the inner leads by metal wires. In particular, when chips are greatly different in shape like a memory chip and a controller chip forming a semiconductor memory device, it is difficult to connect the small chip (controller chip) and inner leads. Nor is it possible to directly connect the semiconductor chips to each other by metal wires in an electric circuit manner.

To solve these problems, it has been considered to stack a relay substrate and a small chip in order on a large chip or to dispose a relay substrate and a small chip on a large chip. The upper small chip is connected to the relay substrate via metal wires, and the relay substrate is connected to the lower large chip and inner leads via metal wires. The connection structure using the relay substrate becomes a factor of increasing manufacturing cost and manufacturing man-hours of a semiconductor device. Moreover, since the relay substrate is thicker than the semiconductor chips, the number of mountable semiconductor chips (the number of stacked layers) is reduced by the thickness of the relay substrate.

In order to increase the number of mountable semiconductor chips, it has been considered to mount semiconductor chips on both upper and lower surfaces of a lead frame. JP-A 11-040738 (KOKAI) describes a semiconductor device in which semiconductor chips different in size are mounted on both upper and lower surfaces of a chip mounting portion (die pad) of a lead frame. JP-A 2001-144247 (KOKAI) describes a semiconductor device in which semiconductor chips having the same shape are mounted on both upper and lower surfaces of a lead frame. In the above patent documents, an ordinary bonding structure is employed and no consideration is given to the connection of a small semiconductor chip and inner leads.

BRIEF SUMMARY OF THE INVENTION

A semiconductor device according to a first aspect of the present invention includes: a circuit base including a chip mounting area, an outer lead portion having a plurality of outer leads, and an inner lead portion having a plurality of inner leads, at least part of the inner leads being routed inside the chip mounting area; a first semiconductor chip group, disposed on the chip mounting area in a first surface of the circuit base, including at least one first semiconductor chip having first electrode pads; a second semiconductor chip group, disposed on the chip mounting area in a second surface of the circuit base, including at least one second semiconductor chip having second electrode pads; first metal wires electrically connecting the first electrode pads of the first semiconductor chip and the inner lead portion; second metal wires electrically connecting the second electrode pads of the second semiconductor chip and the inner lead portion; and a resin sealing portion sealing the first and second semiconductor chip groups together with the first and second metal wires, wherein at least part of the first electrode pads of the first semiconductor chip are electrically connected to the second electrode pads of the second semiconductor chip via the inner leads.

A semiconductor device according to a second aspect of the present invention includes: a circuit base including a chip mounting area, a first outer lead portion having first outer leads, a second outer lead portion having second outer leads opposed to the first outer leads via the chip mounting area, and an inner lead portion having first inner leads connected to the first outer leads, second inner leads connected to the second outer leads and third inner leads electrically independent of the first and second outer leads, at least part of the first, second, and third inner leads being routed inside the chip mounting area; a first semiconductor chip group, disposed on the chip mounting area in a first surface of the circuit base, including at least one first semiconductor chip having first electrode pads; a second semiconductor chip group, disposed on the chip mounting area in a second surface of the circuit base, including at least one second semiconductor chip having second electrode pads; first metal wires electrically connecting the first electrode pads of the first semiconductor chip and the inner lead portion; second metal wires electrically connecting the second electrode pads of the second semiconductor chip and the inner lead portion; and a resin sealing portion sealing the first and second semiconductor chip groups together with the first and second metal wires, wherein at least part of the first electrode pads of the first semiconductor chip are electrically connected to the second electrode pads of the second semiconductor chip via the third inner lead.

DETAILED DESCRIPTION OF THE INVENTION

Hereinafter, embodiments for carrying out the present invention will be described. First, a semiconductor device according to a first embodiment of the present invention will be described with reference to FIG. 1 to FIG. 7.

Figure 1:
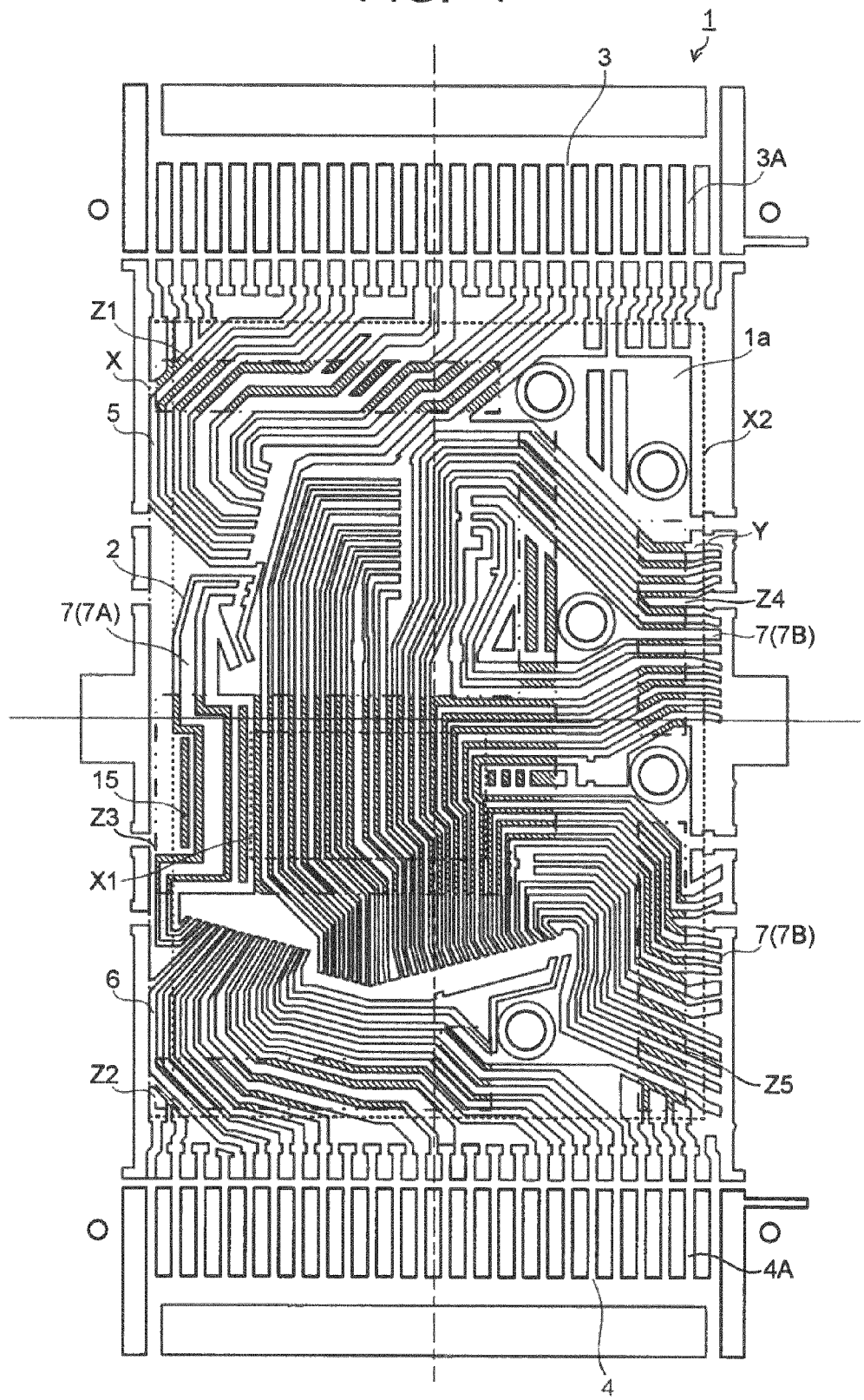
FIG. 1 is a plane view showing a lead frame used in a semiconductor device of a first embodiment.

FIG. 1 is a plane view showing a lead frame used in a semiconductor device of the first embodiment. FIG. 2 to FIG. 6 are views showing the semiconductor device of the first embodiment, FIG. 2 being a top view showing a state where semiconductor chips are mounted on the lead frame shown in FIG. 1, FIG. 3 being a bottom view showing the state where the semiconductor chips are mounted on the lead frame shown in FIG. 1, FIG. 4 being a cross-sectional view taken along A-A line in FIG. 2, FIG. 5 being a cross-sectional view showing a state where the lead frame on which the semiconductor chips are mounted is resin-sealed, and FIG. 6 being a front view of the semiconductor device.

The lead frame 1 shown in FIG. 1 includes an inner lead portion 2 which serves as a connection portion with the semiconductor chips and a first and a second outer lead portion 3, 4 which serve as external connection terminals. The first outer lead portion 3 has a plurality of outer leads (first outer leads) 3A, and the second outer lead portion 4 has a plurality of outer leads (second outer leads) 4A. The inner lead portion 2 has first inner leads 5 connected to the first outer leads 3A, second inner leads 6 connected to the second outer leads 4A, third inner leads 7 electrically independent of the outer leads 3A, 4A.

The lead frame 1 has a first surface (upper surface) 1a and a second surface (lower surface) 1b opposed to the first surface 1a. The semiconductor chips are mounted on the upper and lower surfaces 1a, 1b of the lead frame 1. In the first surface 1a of the lead frame 1, a first chip mounting area X1 is set, and in the second surface 1b, a second chip mounting area X2 is set. On each of the first and second surfaces 1a, 1b of the lead frame 1, at least one semiconductor chip is mounted. The semiconductor chip disposed on the first surface 1a forms a first semiconductor chip group, and the semiconductor chip disposed on the second surface 1b forms a second semiconductor chip group.

Figure 2:
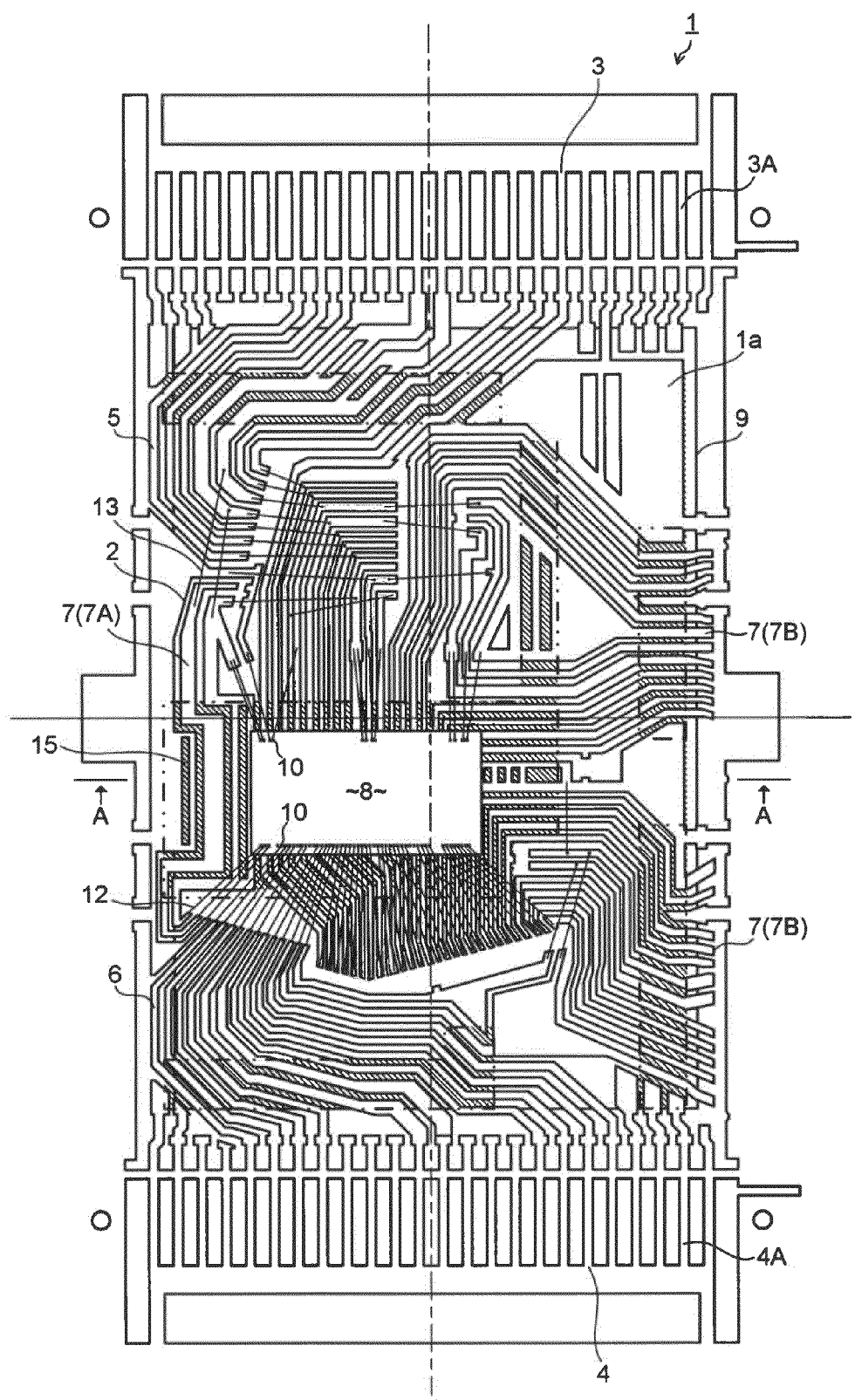
FIG. 2 is a top view showing a state where semiconductor chips are mounted on the lead frame shown in FIG. 1.
Figure 3:
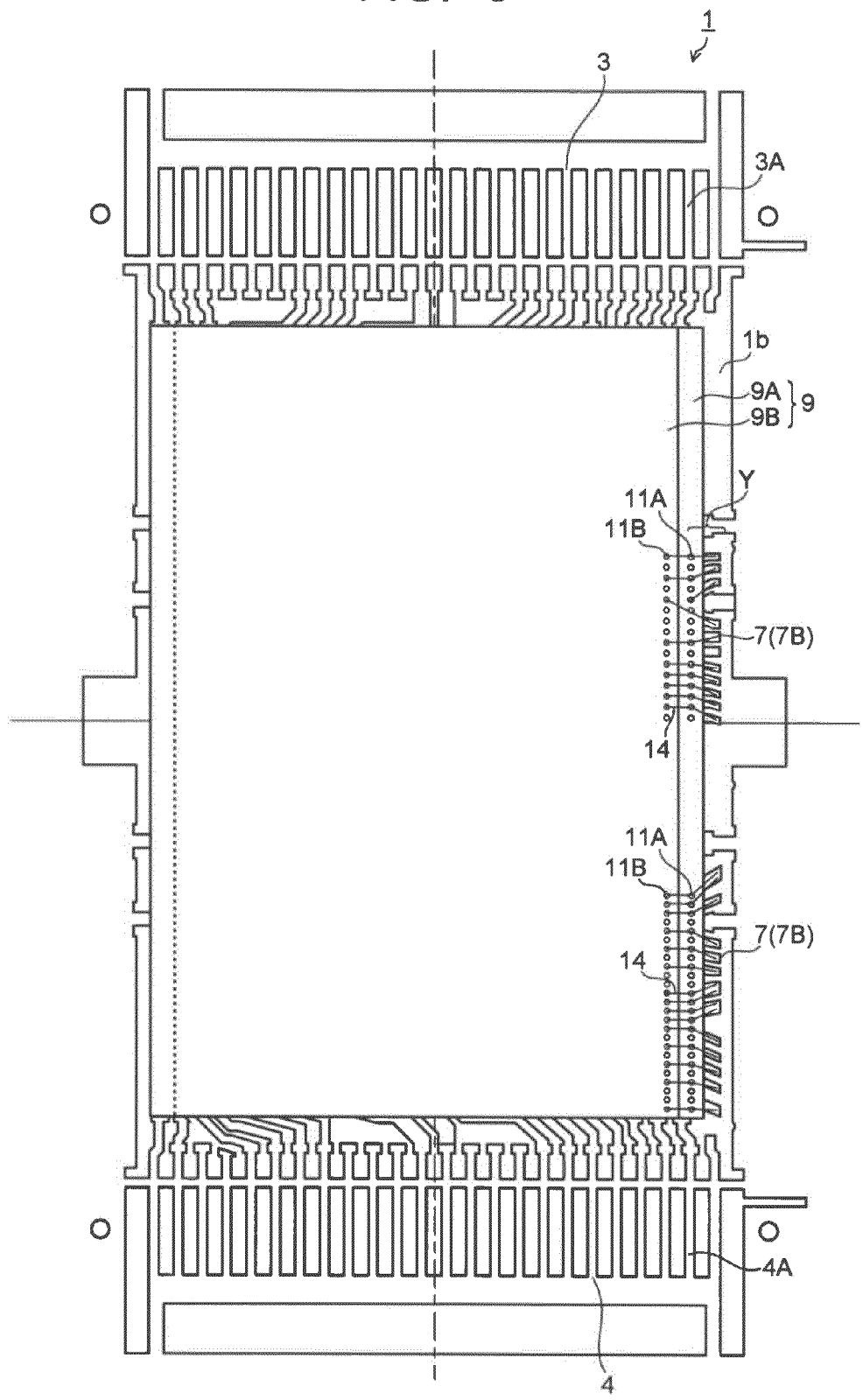
FIG. 3 is a bottom view of FIG. 2.
Figure 4:
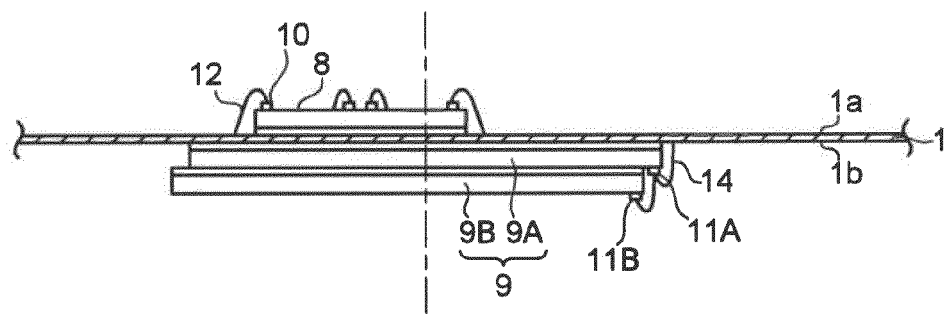
FIG. 4 is a cross-sectional view taken along A-A line in FIG. 2.
Figure 5:
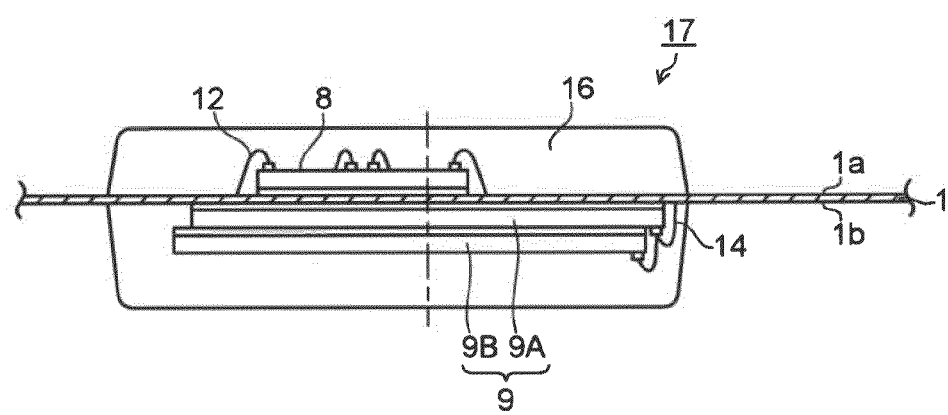
FIG. 5 is a cross-sectional view showing the semiconductor device (after molding) of the first embodiment.
Figure 6:
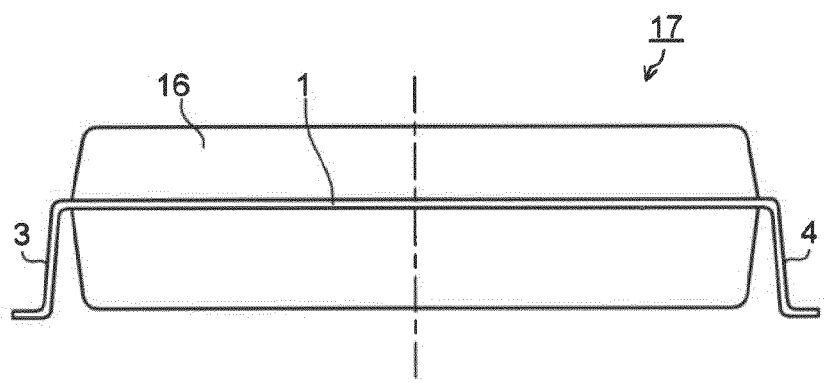
FIG. 6 is a front view of the semiconductor device shown in FIG. 5.

As shown in FIG. 2 to FIG. 4, a small first semiconductor chip 8 is mounted on the first surface 1a of the lead frame 1. The first semiconductor chip 8 is disposed on the first chip mounting area X1 whose shape corresponds to the shape of the first semiconductor chip 8. Second semiconductor chips 9 (9A, 9B) larger in shape (outer shape) than the first semiconductor chip 8 are mounted on the second surface 1b of the lead frame 1. The two semiconductor chips 9A, 9B are stacked. The shape of the second chip mounting area X2 corresponds to the shape of the lower semiconductor chip 9A. The semiconductor chip 9A is disposed on the second chip mounting area X2 and the semiconductor chip 9B is stacked on the semiconductor chip 9A in a stepped manner.

A possible concrete example of the second semiconductor chips 9A, 9B is a semiconductor memory chip (memory device) such as a NAND flash memory. A possible concrete example of the first semiconductor chip 8 is a controller chip (controller device) of the NAND flash memories. The number of the stacked semiconductor chips 9 in the second semiconductor chip group is not limited to two, but may be three or more. The semiconductor device including the semiconductor memory chips (second semiconductor chips 9) and the controller chip (first semiconductor chip 8) thereof form a semiconductor storage device. The semiconductor device is not limited to the semiconductor storage device but is applicable to a semiconductor device in which the semiconductor chips 8, 9 different in outer shape are mounted on the upper and lower surfaces 1a, 1b of the lead frame 1.

The lead frame 1 is formed so as to be adaptable to the large second semiconductor chips 9A, 9B mounted on the second surface 1b and has a shape based on the outer shape of the second semiconductor chips 9A, 9B. Since the first semiconductor chip 8 is smaller than the second semiconductor chips 9, the first chip mounting area X1 is located on an inner side of the second chip mounting area X2. The lead frame 1 has a chip mounting area X adaptable to a plane shape of the second semiconductor chips 9A, 9B (a plane-direction projected shape of the semiconductor chips 9A, 9B stacked in the stepped manner). The inner lead portion 2 and the outer lead portions 3, 4 are arranged with the chip mounting area X serving as a guideline.

The first outer lead portion 3 is disposed along one shorter side of the chip mounting area X. The second outer lead portion 4 is disposed along the other shorter side of the chip mounting area X. The first outer lead portion 3 is opposed to the second outer lead portion 4 via the chip mounting area X. The first and second outer lead portions 3, 4 are disposed so that the outer leads 3A, 4A project from both shorter sides of a resin sealed body of the semiconductor device (semiconductor package) formed by using the lead frame 1.

The first semiconductor chip 8 has a rectangular outer shape and has electrode pads 10 arranged along its both longer sides. The first semiconductor chip 8 is disposed so that its shorter sides become parallel to longer sides of the chip mounting area X. To enable the wire-bonding of the electrode pads 10 of the first semiconductor chip 8 and the inner lead portion 2, part of the inner lead portion 2 (at least part of the first to third inner leads 5, 6, 7) needs to be disposed near the electrode pads 10 of the first semiconductor chip 8. The first chip mounting area X1 is smaller than the chip mounting area X and is set on an inner side of the chip mounting area X, and therefore, at least part of the inner lead portion 2 needs to be disposed in the chip mounting area X.

The second semiconductor chips 9 (9A, 9B) have rectangular outer shapes and have electrode pads 11 (11A, 11B) arranged along their longer sides on one side. To enable the wire-bonding of the electrode pads 11 of the second semiconductor chips 9 and the inner lead portion 2, part of the inner lead portion 2 needs to be disposed near the electrode pads 11 of the second semiconductor chips 9. The second chip mounting area X2 on which the second semiconductor chips 9 are disposed has substantially the same shape as that of the chip mounting area X. Therefore, part of the inner lead portion 2 needs to be disposed in a connection area Y with the second semiconductor chips 9 which area Y is disposed along the one longer side of the chip mounting area X.

The first inner leads 5 have one ends connected to the first outer leads 3A and other ends disposed in the chip mounting area X. The first inner leads 5 are routed inside the chip mounting area X. The second inner leads 6 have one ends connected to the second outer leads 4A and other ends disposed in the chip mounting area X. The other ends of the second inner leads 6 are located near the first chip mounting area X1 so as to be connectable to the first semiconductor chip 8. The second inner leads 6 are routed (wired) inside the chip mounting area X so as to reach the vicinity of the first chip mounting area X1 from the second outer lead portion 4.

The third inner leads 7 have inner leads 7A mainly relaying the connection between the first semiconductor chip 8 and the first outer leads 3A or the second outer leads 4A, and inner leads 7B mainly relaying the connection between the first semiconductor chip 8 and the second semiconductor chips 9. The inner leads 7A, 7B included in the third inner leads 7 are both disposed in the chip mounting area X. Further, the inner leads 7A, 7B are routed inside the chip mounting area X so as to enable the connection between the semiconductor chip 8 and the outer leads 3A, 4A, and the connection between the semiconductor chips 8, 9.

The inner leads 7A in the third inner leads 7 are located near the first chip mounting area X1. The inner leads 7A are routed inside a neighborhood area of the first semiconductor chip 8. The inner leads 7B have one ends located near the first chip mounting area X1 and the other ends disposed in the connection area Y with the second semiconductor chips 9. The other ends of the inner leads 7B form the connection portions with the second semiconductor chips 9 having a single-long-side pad structure. In this manner, the inner leads 7B are routed inside the chip mounting area X1 from the neighborhood area of the first semiconductor chip 8 to the connection area Y with the second semiconductor chips 9.

The first semiconductor chip 8 is bonded on the first chip mounting area X1 of the lead frame 1. The electrode pads 10 of the first semiconductor chip 8 are electrically connected to the first, second, and third inner leads 5, 6, 7 (7A, 7B) of the inner lead portion 2 via first metal wires 12. The first metal wires 12 are connected to front surfaces of the inner leads 5, 6, 7 (upper surface 1a). A part of the electrode pads 10 are connected to the outer leads 3A, 4A via the first and second inner leads 5, 6 and so on. A part of the electrode pads 10 are connected to the second semiconductor chips 9 via the third inner leads 7A, 7B and so on.

A part of the electrode pads 10 (power supply pads Vcc, Vss, and so on) of the first semiconductor chip 8 are electrically connected to the outer leads 3A, 4A via the metal wires 12 and the inner leads 5, 6, or via the metal wires 12, the inner leads 7A, metal wires 13, and the inner leads 5, 6. The metal wires 13 are relay wires and electrically connect the inner leads 7A and the inner leads 7B and electrically connect the inner leads 7A, 7B and the inner leads 5, 6.

A part of the electrode pads 10 (function pads and so on) of the first semiconductor chip 8 are electrically connected to the outer leads 3A, 4A via the metal wires 12 and the inner leads 5, 6, or via the metal wires 12, the inner leads 7A, the metal wires 13 and the inner leads 5, 6. A part of the electrode pads 10 (function pads and so on) are electrically connected to the electrode pads 11 of the second semiconductor chips 9 via the metal wires 12, the inner leads 7B and metal wires 14, or via the metal wires 12, the inner leads 7A, the metal wires 13, the inner lead 7B and the metal wires 14.

The second semiconductor chips 9A, 9B are stacked on the second chip mounting area X2 of the lead frame 1 and is disposed so that the electrode pads 11A, 11B are located along the one longer side of the chip mounting area X. The lower semiconductor chip 9A is bonded on the second chip mounting area X2. The upper semiconductor chip 9B is stacked in a stepped manner on the lower semiconductor chip 9A so that the electrode pads 11A of the lower semiconductor chip 9A are exposed. The semiconductor chip 9B is bonded on the semiconductor chip 9A. The second metal wires 14 are connected to rear surfaces of the inner leads 7 (lower surface 1b).

A part of the electrode pads 11A, 11B (power supply pads Vcc, Vss, and so on) of the second semiconductor chips 9A, 9B are electrically connected to the outer leads 3A, 4A via the metal wires 14, the inner leads 7B, the metal wires 13, and the inner leads 5, 6, or via the metal wires 14, the inner leads 7B, the metal wires 13, the inner leads 7A, the metal wires 13, and the inner leads 5, 6. A part of the electrode pads 11A, 11B (function pads and so on) of the second semiconductor chips 9A, 9B are electrically connected to the electrode pads 10 of the first semiconductor chip 8 via the metal wires 14, the inner leads 7B, and the metal wires 12, or via the metal wires 14, the inner leads 7B, the metal wires 13, the inner leads 7A, and the metal wires. 12.

Regarding the connection of the electrode pads 11A, 11B of the semiconductor chips 9A, 9B, when their electric characteristics and signal characteristics are the same, the sequential connection between the electrode pads 11A, 11B by the second metal wires 14 is possible. That is, the electrode pads 11A, of the semiconductor chip 9A and the electrode pads 11B of the semiconductor chip 9B are connected by the metal wires 14. Further, the electrode pads 11A of the semiconductor chip 9A and the third inner leads 7 (7A, 7B) are connected by the metal wires 14. The wire bonding of each pair of the pads may be performed separately, or the pads may be connected in sequence by one metal wire. A part of the electrode pads 11A, 11B are connected individually to the third inner leads 7 (7A, 7B).

The electrode pads 11A, 11B of the second semiconductor chips 9A, 9B are electrically connected to the electrode pads 10 of the first semiconductor chip 8 via the third inner leads 7. The second semiconductor chips 9A, 9B are connected to the first and second outer lead portions 3, 4 via the inner lead portion 2 and the first semiconductor chip 8. A part of the electrode pads 11A, 11B of the second semiconductor chips 9A, 9B may be connected to the outer leads 3A, 4A not via the first semiconductor chip 8 but only via the inner lead portion 2 (the inner leads 5, 6 or the inner leads 5, 6 through the inner leads 7).

As described above, at least part of the inner lead portion 2 is routed inside the chip mounting area X. This makes it possible to lead one ends of the inner leads 5, 6, 7 to the vicinity of the small semiconductor chip 8. Therefore, even when the small semiconductor chip 8 is mounted on the upper surface 1a of the lead frame 1 which is formed based on the shape of the large semiconductor chips 9, it is possible to connect the electrode pads 10 of the semiconductor chip 8 and the inner leads 5, 6, 7 via the metal wires 12, 14 in a good condition. That is, it is possible to form a semiconductor device by mounting the semiconductor chips 8, 9 having different outer shapes on the upper and lower surfaces 1a, 1b of the lead frame 1.

Further, since the inner lead portion 2 has the third inner leads 7 electrically independent of the outer lead portions 3, 4, the use of such third inner leads 7 enables the electrical connection between the first semiconductor chip 8 and the second semiconductor chips 9. Therefore, it is possible to electrically connect the small semiconductor chip 8 mounted on the upper surface 1a of the lead frame 1 and the large semiconductor chips 9 mounted on the lower surface 1b without using a relay substrate. This means that a package structure using the lead frame 1 can be employed without using the relay substrate even when the connection between the semiconductor chips 8, 9 is relatively complicated.

According to the first embodiment, it is possible to provide a semiconductor device in which the package structure using the lead frame 1 is adopted, and even more, the plural semiconductor chips 8, 9 having different outer shapes are mounted on the upper and lower surfaces 1a, 1b of the lead frame 1 and the plural semiconductor chips 8, 9 are electrically connected. Even in an electric circuit in which the connection between the semiconductor chips 8, 9 and the connection between the semiconductor chips 8, 9 and external terminals (the outer lead portions 3, 4 of the lead frame 1) are relatively complicated, these connections can be enabled by the inner leads 5, 6, 7 and the metal wires 12, 13, 14 (including the relay metal wires). Therefore, it is possible to realize a semiconductor device having various kinds of stack structures and connection structures, with the package using the lead frame 1.

Incidentally, not being connected to the outer leads 3A, 4A, the third inner leads 7 are present independently at a stage prior to the resin sealing or prior to the mounting of the semiconductor chips 8, 9. Since the structure as the lead frame 1 cannot be maintained in this state, the third inner leads 7 prior to the resin sealing need to be supported in some way. Further, since the first and second inner leads 5, 6 also have a relatively complicated circuit shape, it is also preferable to support the first and second inner leads 5, 6 in some way, in consideration of handlability and wire bondability of the lead frame 1.

In the first embodiment, insulating resin 15 is filled in gaps between the adjacent inner leads 5, 6, 7. The insulating resin 15 is filled in the gaps between the inner leads 5, 6, 7 in areas Z capable of effectively holding the inner leads 5, 6, 7. The lead frame 1 has a first resin filling area Z1 holding the first inner leads 5, a second resin filling area Z2 holding the second inner leads 6, and a third to a fifth resin filling area Z3 to Z5 holding the third inner leads 7. Incidentally, the insulating resin 15 may be filled in all the gaps between the inner leads 5, 6, 7 present in the chip mounting area X of the lead frame 1.

The insulating resin 15 is filled in the gaps between the first inner leads 5 located in the first resin filling area Z1. The first inner leads 5 are held by the insulating resin 15 in the first resin filling area Z1. Similarly, the insulating resin 15 is filled in the gaps between the second inner leads 6 present in the second resin filling area Z2. The second inner leads 6 are held by the insulating resin 15 in the second resin filling area Z2. This can enhance wire bondability to the inner leads 5, 6.

The insulating resin 15 is filled in the gaps between the third inner leads 7 located in the third to fifth resin filling areas Z3 to Z5. Portions of the third inner leads 7 located in the neighborhood area of the first semiconductor chip 8 are held by the insulating resin 15 in the third insulating resin filling area Z3. The third inner leads 7 are routed from the neighborhood area of the first semiconductor chip 8 to the connection area Y with the second semiconductor chips 9. The connection area Y-side ends of the third inner leads 7 are held by the insulating resin 15 in the fourth and fifth resin filling areas Z4, Z5. This can enhance handlability of the lead frame 1 having the independent inner leads 7 and wire bondability to the inner leads 7.

As the insulating resin 15, either thermosetting resin or thermoplastic resin may be employed. The insulating resin 15 is preferably resin which has high flowability when it is heated, for example, epoxy resin, acrylic resin, or the like. A filling process of the insulating resin 15 will be described later. Incidentally, tip portions of the inner leads 5, 6, 7 before the insulating resin 15 is filled are coupled to one another, and the shape of the lead frame 1 is maintained. By cutting the coupled portions of the inner leads 5, 6, 7 after the insulating resin 15 is filled, the lead frame 1 of the first embodiment is formed.

Incidentally, since the first, second, and third inner leads 5, 6, 7 are routed inside the chip mounting area X, a part of the inner leads 5, 6, 7 are sandwiched by the first semiconductor chip 8 and the second semiconductor chips 9. Gap portions between the inner leads located in an area where the semiconductor chips 8, 9 overlap with each other cannot be fully filled only with sealing resin and thus space is likely to remain in these portions. When such a semiconductor package is put under a high-humidity environment, moisture absorbed in the package enters the gaps between the inner leads and the moisture may possibly cause a short circuit between the inner leads.

In the first embodiment, the third resin filling area Z3 corresponds to the first chip mounting area X1. Therefore, the insulating resin 15 is filled in advance in the gap portions between the inner leads 5, 6, 7 (in particular, the gap portions between the third inner leads 7) located in the area where the first semiconductor chip 8 and the second semiconductor chips 9 overlap with each other. The insulating resin 15 is formed in a process different from a process of forming resin included in a resin sealing portion of the semiconductor device (semiconductor package). The insulating resin 15 is filled in the gaps between the inner leads 5, 6, 7 in advance before the formation of the resin sealing portion.

The insulating resin 15 is present not only in the gap portions between the inner leads 5, 6, 7 but part thereof may be present in a layered form on the upper surface 1a (or the lower surface 1b) of the lead frame 1. Further, by using an insulating resin sheet having a base film coated with insulating resin, the base film may be pressure-bonded on the lower surface 1b (or the upper surface 1a) of the lead frame 1 while the insulating resin is filled in the gap portions between the inner leads 5, 6, 7.

The insulating resin 15 is filled in the gap portions between the inner leads 5, 6, 7 as follows, for example. First, an insulating resin sheet is prepared in which an insulating resin layer is formed by coating an insulative base film with an insulating resin composition which serves as the insulating resin 15. The thickness of the insulating resin layer is set in consideration of the volume of the gaps in which the insulating resin is filled. The insulating resin sheet is thermocompression-bonded to the lower surface 1b of the lead frame 1, and the insulating resin layer is filled in at least parts of the gaps between the inner leads 5, 6, 7. To fill the insulating resin layer in the gaps between the inner leads 5, 6, 7, flowability is given thereto by heating and a pressing force is applied thereto via the base film.

Another method for filling the insulating resin 15 in the gaps between the inner leads 5, 6, 7 may be to thermocompression-bond an insulating resin film, which is a film made of only the insulating resin 15, to the lead frame 1. Still another alternative method for filling the insulating resin 15 in the gaps between the inner leads 5, 6 may be to coat the resin filling areas Z1 to Z5 of the lead frame 1 with liquid insulating resin. As the liquid insulating resin, epoxy thermosetting resin is used, for instance. A printing method or the like is used for applying the liquid insulating resin, and a pressing force is applied when necessary.

By filling the insulating resin 15 in the gap portions between the inner leads 5, 6, 7 located in the area where the first semiconductor chip 8 and the second semiconductor chips 9 overlap with each other, the gaps between the inner leads 5, 6, 7 do not remain as space even when the semiconductor chips 8, 9 are mounted on the both surfaces (the first and second surfaces 1a, 1b) of the lead frame 1. This can prevent the occurrence of a short circuit and the like ascribable to the entrance of the moisture absorbed in the semiconductor package into the gaps between the inner leads 5, 6, 7. That is, it is possible to provide a highly reliable semiconductor package (semiconductor device) having the double-sided mounting structure.

The first semiconductor chip 8 mounted on the upper surface 1a of the lead frame 1 and the second semiconductor chips 9 mounted on the lower surface 1b are sealed by the resin sealing portion 16 together with the inner lead portion 2 and the metal wires 12, 13, 14. As the resin sealing portion 16, ordinary epoxy resin is used. They form a semiconductor device 17 with the double-sided mounting structure. In the semiconductor device 17, the finally cut lead frame 1 forms a circuit base. The circuit base includes the inner lead portion 2, the outer lead portions 3, 4, and the chip mounting area X. The semiconductor device 17 of the first embodiment realizes an increased capacity by stacking the semiconductor memory devices (second semiconductor chips 9) and is suitable as a large-capacity, high-function semiconductor storage device on which the controller device (first semiconductor chip 8) is further mounted with the semiconductor memory devices.

According to the semiconductor device 17 of the first embodiment, based on the structure, shape, and so on of the inner lead portion 2, it is possible to easily perform the connection between the semiconductor chips 8, 9, in particular, the small semiconductor chip 8 and the lead frame 1 (wire bonding) and the electrical connection between the semiconductor chips 8, 9 when the semiconductor chips 8, 9 having different outer shapes are mounted on the upper and lower surfaces 1a, 1b of the lead frame 1. Further, the insulating resin 15 filled in at least parts of the gaps between the inner leads 5, 6, 7 can produce an effect of improving handlability of the lead frame 1 having the independent inner leads 7, an effect of preventing a short circuit ascribable to the gap portions (space) between the inner leads 5, 6, 7, and so on. Therefore, it is possible to provide the semiconductor device 17 in which capability of mounting the semiconductor chips 8, 9 having various kinds of shapes, connectability, reliability, and so on are improved.

Figure 7:
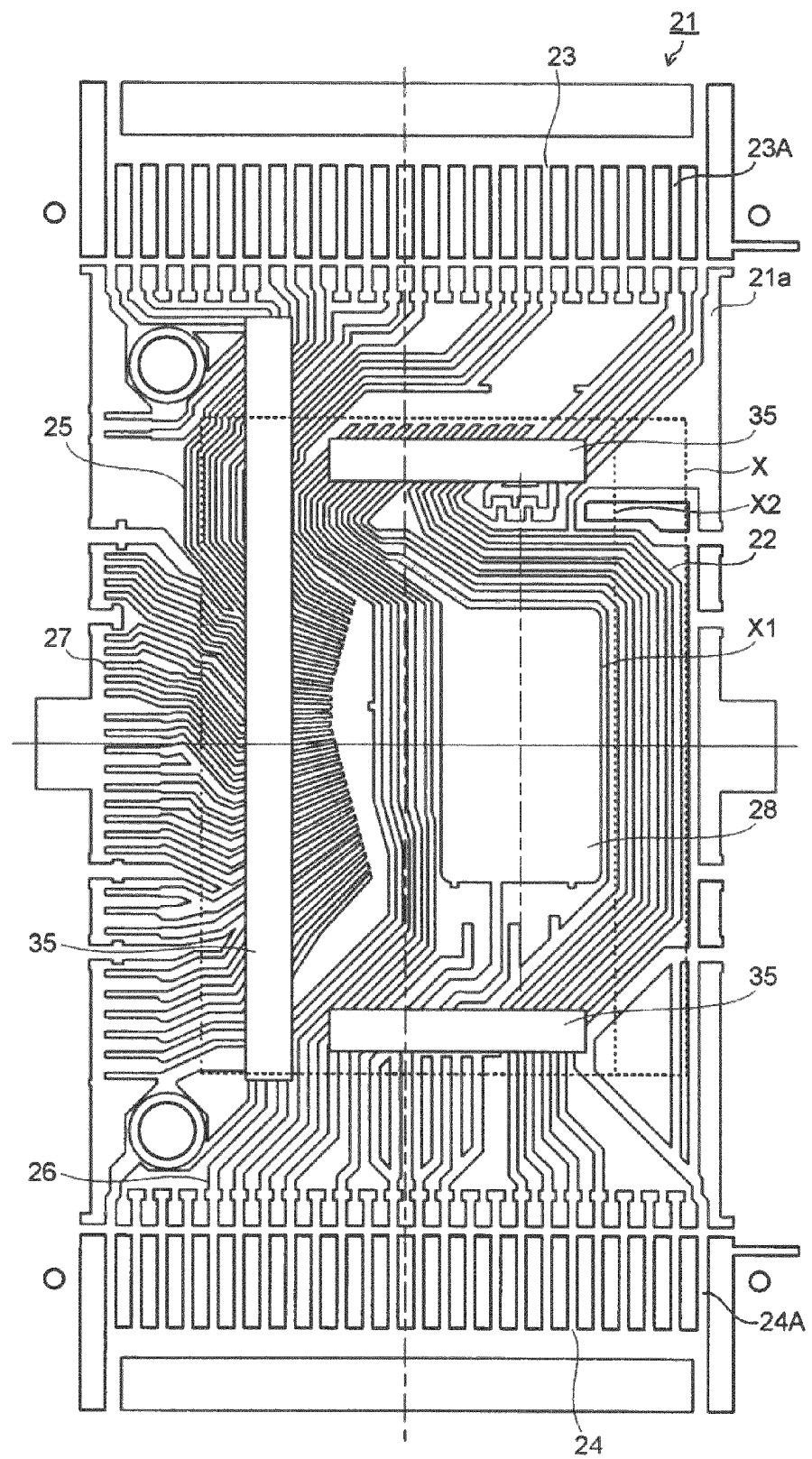
FIG. 7 is a plane view showing a lead frame used in a semiconductor device of a second embodiment.

Next, a semiconductor device according to a second embodiment of the present invention will be described with reference to FIG. 7 to FIG. 11. FIG. 7 is a plane view showing a lead frame used in the semiconductor device of the second embodiment. FIG. 8 to FIG. 11 are views showing the semiconductor device of the second embodiment, FIG. 8 being a top view showing a state where semiconductor chips are mounted on the lead frame shown in FIG. 7, FIG. 9 being a bottom view showing the state where the semiconductor chips are mounted on the lead frame shown in FIG. 7, FIG. 10 being a cross-sectional view taken along A-A line in FIG. 8, and FIG. 11 being a cross-sectional view showing a state where the lead frame on which the semiconductor chips are mounted is resin-sealed.

The lead frame 21 shown in FIG. 7 includes an inner lead portion 22 which serves as a connection portion with the semiconductor chips and a first and a second outer lead portion 23, 24 which serve as external connection terminals. The first outer lead portion 23 has a plurality of outer leads (first outer leads) 23A, and the second outer lead portion 24 has a plurality of outer leads (second outer leads) 24A. Similarly to the first embodiment, the inner lead portion 22 has first inner leads 25 connected to the first outer leads 23A, second inner leads 26 connected to the second outer leads 24A, third inner leads 27 electrically independent of the outer leads 23A, 24A.

The lead frame 21 has a first surface (upper surface) 21a and a second surface (lower surface) 21b opposite the first surface 21a. In the first surface 21a of the lead frame 21, a first chip mounting area X1 is set. In the first chip mounting area X1, an island portion 28 is provided. In the second surface 21b of the lead frame 21, a second chip mounting area X2 is set.

Figure 8:
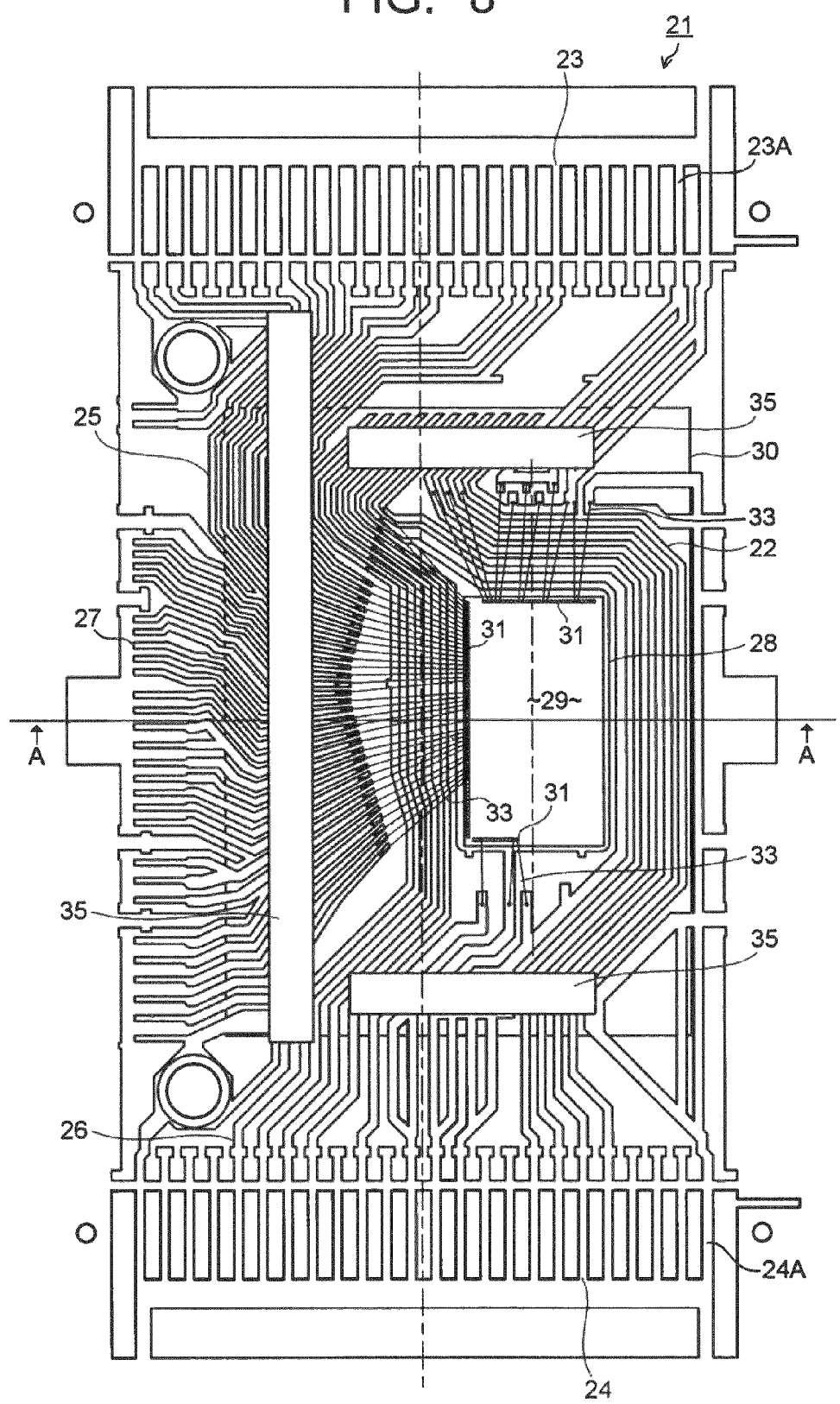
FIG. 8 is a top view showing a state where semiconductor chips are mounted on the lead frame shown in FIG. 7.
Figure 9:
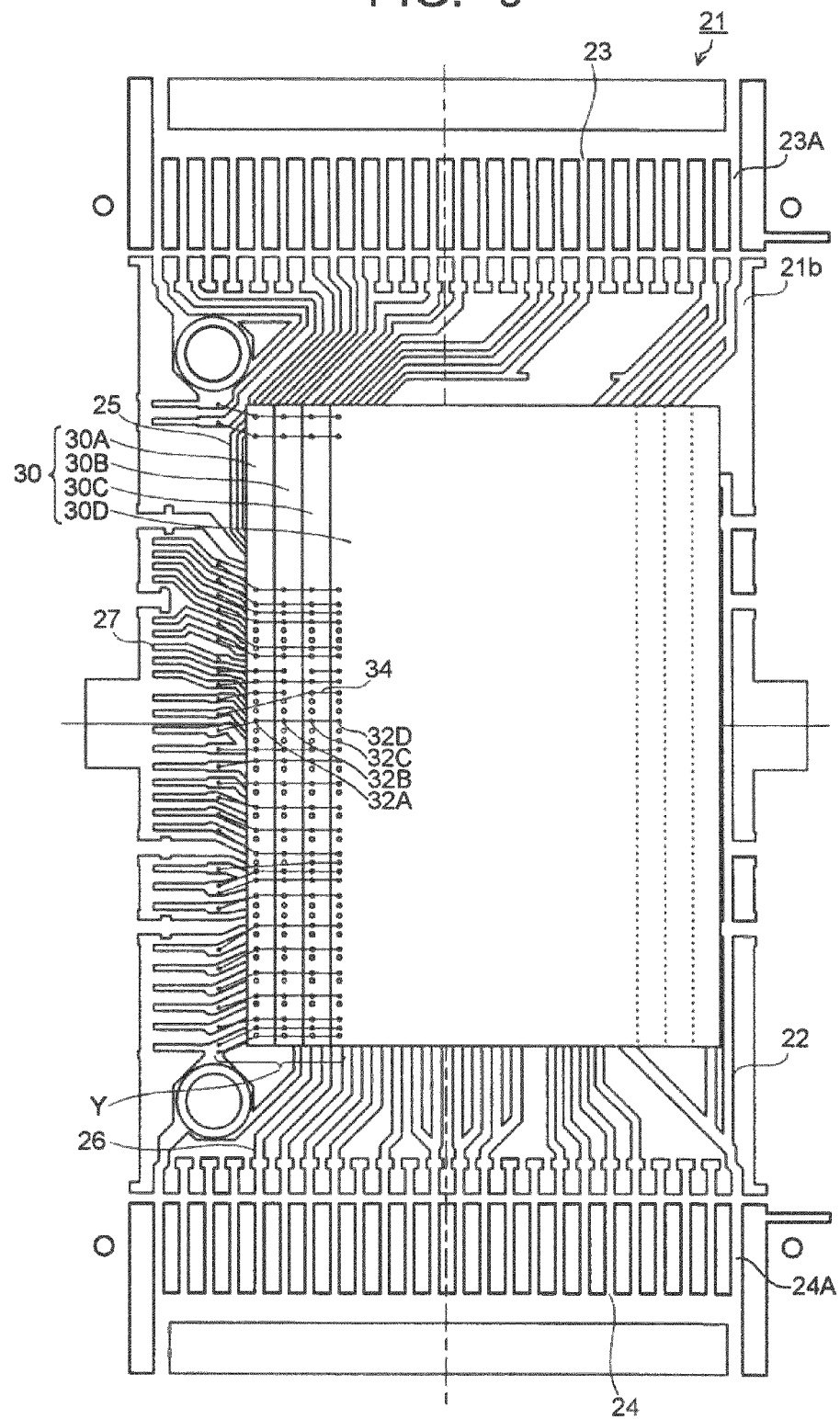
FIG. 9 is a bottom view of FIG. 8.
Figure 10:
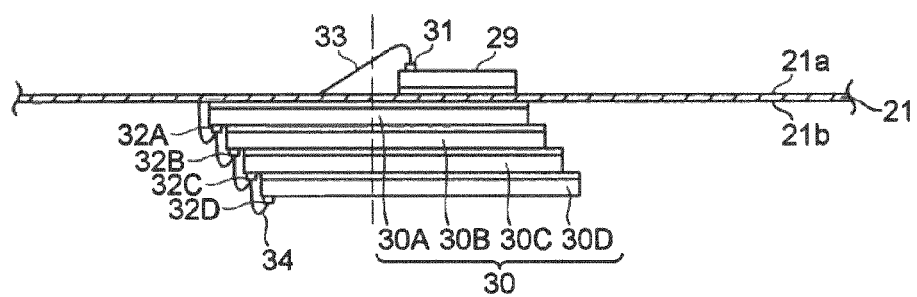
FIG. 10 is a cross-sectional view taken along A-A line in FIG. 8.
Figure 11:
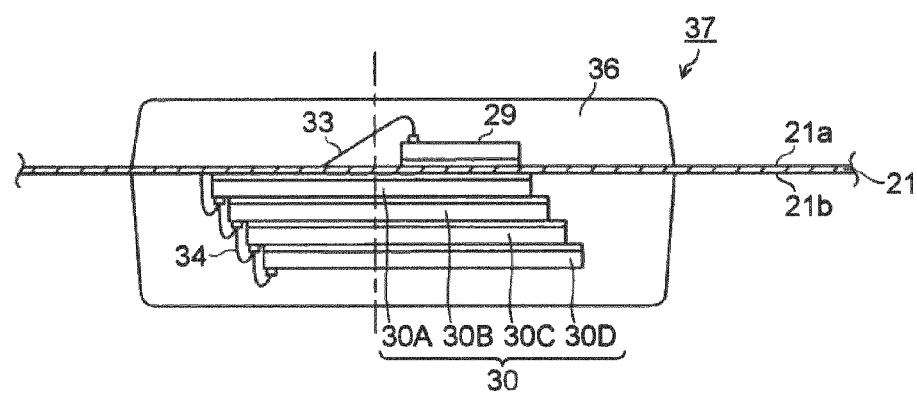
FIG. 11 is a cross-sectional view showing the semiconductor device (after molding) of the second embodiment.

As shown in FIG. 8 to FIG. 10, a small first semiconductor chip 29 is mounted on the first surface 21a of the lead frame 21. The first semiconductor chip 29 is disposed on the island portion 28. The island portion 28 is made of a plate portion having an area large enough to support the whole surface of the semiconductor chip. At least one semiconductor chip 29 is mounted on the first surface 21a of the lead frame 21. The semiconductor chip 29 disposed on the first surface 21a forms a first semiconductor chip group.

On the second surface 21b of the lead frame 21, second semiconductor chips 30, for example, four semiconductor chips 30A to 30D larger in shape (outer shape) than the first semiconductor chip 29 are mounted. The shape of the second chip mounting area X2 corresponds to the shape of the lowest semiconductor chip 30A. The semiconductor chip 30A is disposed on the second chip mounting area X2, and the semiconductor chips 30B to 30D are stacked in order on the semiconductor chip 30A in a stepped manner. On the second surface 21b of the lead frame 21, at least one semiconductor chip 30 is mounted. The semiconductor chips 30A to 30D mounted on the second surface 21b form a second semiconductor chip group.

A possible concrete example of the second semiconductor chips 30A to 30D is a semiconductor memory chip (memory device) such as a NAND flash memory as in the first embodiment. A possible concrete example of the first semiconductor chip 29 is a controller chip (controller device) of the NAND flash memories. The number of the stacked semiconductor chips 30 in the second semiconductor chip group is not limited to four, but may be two to three, or five or more. The semiconductor device including the semiconductor memory chips (second semiconductor chips 30) and the controller chip (first semiconductor chip 29) thereof form a semiconductor storage device.

The lead frame 21 is formed so as to be adaptable to the large second semiconductor chips 30A to 30D mounted on the second surface 21b and has a shape based on the outer shape of the second semiconductor chips 30A to 30D. Since the first semiconductor chip 29 is smaller than the second semiconductor chips 30, the first chip mounting area X1 (island portion 28) is located on an inner side of the second chip mounting area X2. The lead frame 21 has a chip mounting area X adaptable to a plane shape of the second semiconductor chips 30A to 30D (a plane-direction projected shape of the four semiconductor chips 30A to 30D stacked in the stepped manner). The inner lead portion 22 and the outer lead portions 23, 24 are arranged with the chip mounting area X serving as a guideline.

The first outer lead portion 23 is disposed along one shorter side of the chip mounting area X. The second outer lead portion 24 is disposed along the other shorter side of the chip mounting area X. The first outer lead portion 23 and the second outer lead portion 24 are disposed to face each other via the chip mounting area X. The first and second outer lead portions 23, 24 are disposed so that the outer leads 23A, 24A project from both shorter sides of a resin sealed body of the semiconductor device (semiconductor package) formed by using the lead frame 21.

The first semiconductor chip 29 has a rectangular outer shape and has electrode pads 31 arranged along its one longer side and both shorter sides. The first semiconductor chip 29 is disposed so that its longer sides become parallel to longer sides of the chip mounting area X. The second semiconductor chips 30 (30A to 30D) have rectangular outer shapes and have electrode pads 32 (32A to 32D) arranged along their longer sides on one side. As in the first embodiment, a part of the inner lead portion 22 needs to be disposed near the electrode pads 31 of the first semiconductor chip 29. Further, a part of the inner lead portion 22 needs to be disposed in a connection area Y with the second semiconductor chips 30 which area Y is disposed along the one longer side of the chip mounting area X.

The first inner leads 25 have one ends connected to the first outer leads 23A and the other ends disposed in the chip mounting area X. The other ends of the first inner leads 25 are located near the island portion 28 so as to be connectable to the first semiconductor chip 29. The second inner leads 26 have one ends connected to the second outer leads 24A and the other ends disposed in the chip mounting area X. The other ends of the second inner leads 26 are located near the island portion 28 so as to be connectable to the first semiconductor chip 29. The first and second inner leads 25, 26 extend from the first and second outer lead portions 23, 24 and are routed inside the chip mounting area X so as to reach the vicinity of the island portion 28.

The third inner leads 27 relay the connection between the first semiconductor chip 29 and the second semiconductor chips 30. The third inner leads 27 are routed inside the chip mounting area X so as to enable the connection between the semiconductor chips 29, 30. The third inner leads 27 have one ends located near the island portion 28 and the other ends disposed in the connection area Y with the second semiconductor chips 30. The other ends of the third inner leads 27 form connection portions with the second semiconductor chips 30 having a single-long-side pad structure. The third inner leads 27 are routed inside the chip mounting area X from a neighborhood area of the first semiconductor chip 29 to the connection area Y with the second semiconductor chips 30.

The first semiconductor chip 29 is bonded on the island portion 28 of the lead frame 21. The electrode pads 31 of the first semiconductor chip 29 are connected to the inner leads 25, 26, 27 via first metal wires 33. The first metal wires 33 are connected to front surfaces of the inner leads 25, 26, 27 (upper surface 21a). A part of the electrode pads 31 (power supply pads Vcc, Vss and so on) are connected to the outer leads 23A, 24A via the inner leads 25, 26. A part of the electrode pads 31 (function pads and so on) are connected to the outer leads 23A, 24A via the inner leads 25, 26 and others thereof (function pads and so on) are connected to the second semiconductor chips 30 via the inner leads 27.

The second semiconductor chips 30A to 30D are stacked on the second chip mounting area X2 of the lead frame 21 and is disposed so that the electrode pads 32A to 32D are located along the one longer side of the chip mounting area X. The lowest semiconductor chip 30A is bonded on the second chip mounting area X2. The semiconductor chips 30B to 30D are stacked in order on the semiconductor chip 30A in a stepped manner, each of them being stacked so that the electrode pads 32 of the semiconductor chip 30 on the lower side thereof are exposed. The semiconductor chips 30B to 30D are each bonded on the semiconductor chip 30 on the lower side thereof.

The electrode pads 32A to 32D of the second semiconductor chips 30A to 30D are electrically connected to one another via mainly the third inner leads 27 of the inner lead portion 22 and the second metal wires 34. The second metal wires 34 are connected to the rear surface of the inner lead portion 22 (lower surface 21b). The electrode pads 32A to 32D of the second semiconductor chips 30A to 30D are electrically connected to the electrode pads 31 of the first semiconductor chip 29 via the third inner leads 27. A part of the electrode pads 32A to 32D are connected to the first and second outer leads 23A, 24A not via the first semiconductor chip 29 but via the second metal wires 34 and the first and second inner leads 25, 26.

Regarding the connection of the electrode pads 32A to 32D of the semiconductor chips 30A to 30D, when their electric characteristics and signal characteristics are the same, it is possible to connect the electrode pads 32A to 32D by the second metal wires 34 in sequence. That is, the electrode pads 32A to 32D of the semiconductor chips 30A to 30D are connected to one another by the metal wires 34. Further, the electrode pads 32A of the semiconductor chip 30A and the third inner leads 27 (or the first and second inner leads 25, 26) are connected by the metal wires 34. The wire bonding between each pair of the pads may be performed separately, or the pads may be connected in sequence by one metal wire. A part of the electrode pads 32A to 32D are connected individually to the third inner leads 27.

As described above, at least part of the inner lead portion 22 is routed inside the chip mounting area X. Therefore, it possible to lead one ends of the inner leads 25, 26, 27 to the vicinity of the small semiconductor chip 29. Even when the small semiconductor chip 29 is mounted on the upper surface 21a of the lead frame 21 which is formed based on the shape of the large semiconductor chips 30, it is possible to connect the electrode pads 31 of the semiconductor chip 29 and the inner leads 25, 26, 27 via the metal wires 33. It is possible to form a semiconductor device by mounting the semiconductor chips 29, 30 having different outer shapes on the upper and lower surfaces 21a, 21b of the lead frame 21.

Further, the inner lead portion 22 has the third inner leads 27 electrically independent of the outer lead portions 23, 24. The use of such third inner leads 27 enables the electrical connection between the first semiconductor chip 29 and the second semiconductor chips 30. Therefore, it is possible to electrically connect the small semiconductor chip 29 mounted on the upper surface 21a of the lead frame 21 and the large semiconductor chips 30 mounted on the lower surface 21b without using a relay substrate. This means that a package structure using the lead frame 21 can be employed without using the relay substrate even when the connection between the semiconductor chips 29, 30 is relatively complicated.

According to the second embodiment, it is possible to provide a semiconductor device in which the package structure using the lead frame 21 is adopted, and even more, the plural semiconductor chips 29, 30 having different outer shapes are mounted on the upper and lower surfaces 21a, 21b of the lead frame 21 and the plural semiconductor chips 29, 30 are electrically connected. Even in an electric circuit in which the connection between the semiconductor chips 29, 30 and the connection between the semiconductor chips 29, 30 and external terminals (the outer lead portions 23, 24 of the lead frame 21) are relatively complicated, these connections can be enabled by the inner leads 25, 26, 27 and the metal wires 33, 34. Therefore, it is possible to realize a semiconductor device having various kinds of stack structures and connection structures, with the package using the lead frame 21.

In the lead frame 21 of the second embodiment, the way the inner lead portion 22 is routed is simpler than that of the first embodiment. Further, though the inner lead portion 22 is routed inside the chip mounting area X, part of the inner lead portion 22 is not sandwiched by the first semiconductor chip 29 and the second semiconductor chips 30 because the first semiconductor chip 29 is mounted on the island portion 28. Therefore, in the second embodiment, the inner leads 25, 26, 27 are held by an insulating tape (polyimide tape having an adhesive layer, or the like) 35, which enhances wire bondability at low cost. The insulating tape 35 is stuck on the first surface 21a of the lead frame 21.

The first semiconductor chip 29 mounted on the upper surface 21a of the lead frame 21 and the second semiconductor chips 30 mounted on the lower surface 21b are sealed by a resin sealing portion 36 together with the inner lead portion 22 and the metal wires 33, 34. They form a semiconductor device 37 having a double-sided mounting structure. In the semiconductor device 37, the finally cut lead frame 21 forms a circuit base. The circuit base includes the inner lead portion 22, the outer lead portions 23, 24, the island portion 28, and the chip mounting area X. The semiconductor device 37 of the second embodiment is suitable as a semiconductor storage device similar to that of the first embodiment.

According to the semiconductor device 37 of the second embodiment, based on the structure, shape, and so on of the inner lead portion 22, it is possible to easily perform the connection between the semiconductor chips 29, 30, in particular, the small semiconductor chip 29 and the lead frame 21 and the electrical connection between the semiconductor chips 29, 30 when the semiconductor chips 29, 30 having different outer shapes are mounted on the upper and lower surfaces 21a, 21b of the lead frame 21. Handlability of the lead frame 21 in which at least part of the inner lead portion 22 is routed inside the chip mounting area X is ensured by the low-cost insulating tape 35. Therefore, it is possible to provide the semiconductor device 37 in which capability of mounting the semiconductor chips 29, 30 having various kinds of shapes, connectability, reliability, and so on are improved.

Figure 12:
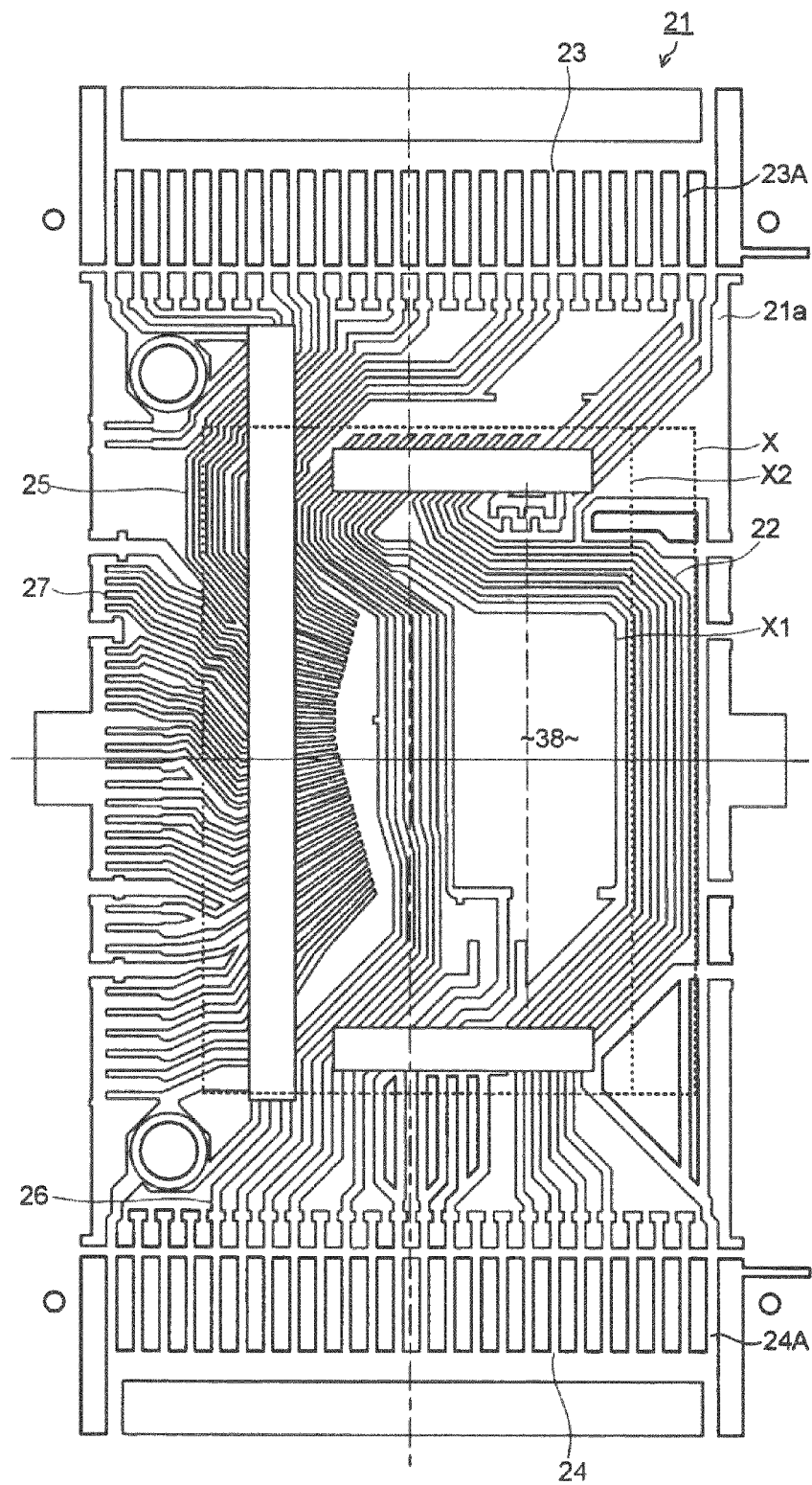
FIG. 12 is a plane view showing a modification example of the lead frame shown in FIG. 7.
Figure 13:
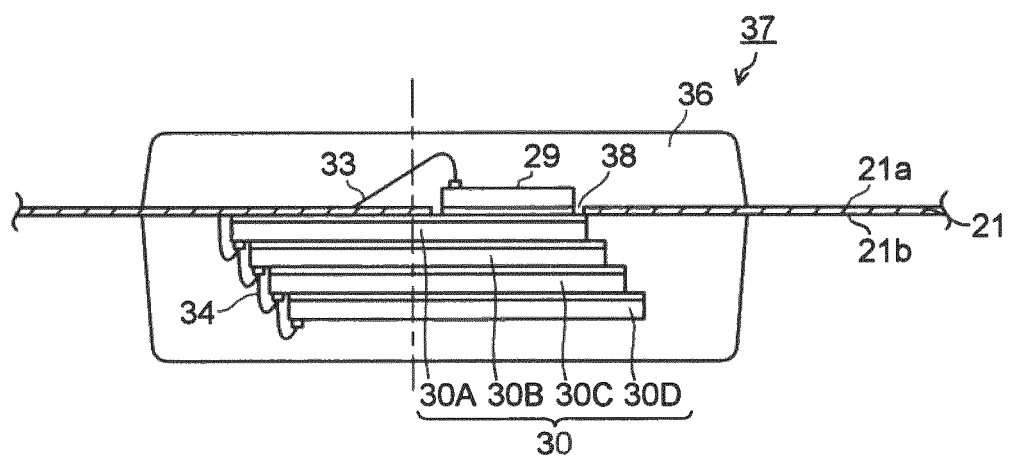
FIG. 13 is a cross-sectional view showing a semiconductor device (after molding) in which semiconductor chips are mounted on the lead frame shown in FIG. 12.

FIG. 7 to FIG. 11 show the lead frame 21 having the island portion 28 as a mounting portion of the first semiconductor chip 29, and the semiconductor device 37 using the lead frame 21. As shown in FIG. 12 and FIG. 13, the mounting portion of the first semiconductor chip 29 may be an opening portion (window portion) 38 provided in the lead frame 21. In this case, the first semiconductor chip 29 is bonded on a rear surface of the lowest second semiconductor chip 30A via the opening portion 38 of the lead frame 21. Such structure enables a reduction in thickness of the stack of the semiconductor chips 29, 30. Further, with the same thickness of the stack of the semiconductor chips 29, 30, it is possible to increase the number of stacked semiconductor chips (for example, the semiconductor chips 30).

The semiconductor chip 29 bonded on the rear surface of the semiconductor chip 30A is thinner than, for example, the lead frame 21. This enables low wiring of the metal wires 33 while preventing neck damage of the metal wires 33. In order to increase the number of the stacked semiconductor chips 30, the low wiring of the metal wires 33 is necessary. At this time, since the metal wires 33 bend directly above metal balls, wire damage may possibly occur. To solve this, by reducing the thickness of the semiconductor chip 29, it is possible to make loop height of the metal wires 33 low even when straight portions of the metal wires 33 above the metal balls are long.

Further, on the rear surface side of the semiconductor chip 30A, only the metal wires may be disposed without the semiconductor chip 29 being mounted (skip bonding).

Figure 14:
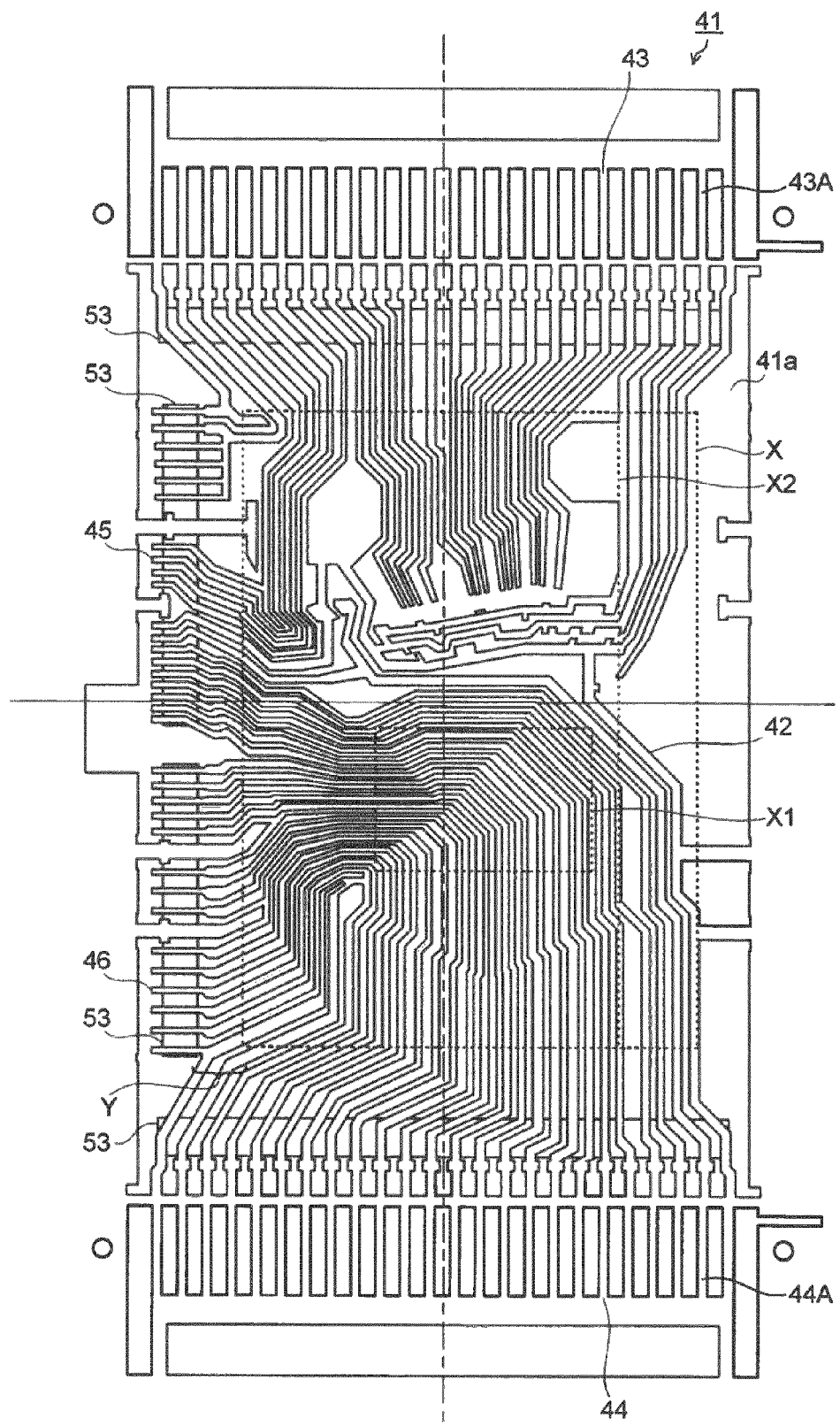
FIG. 14 is a plane view showing a lead frame used in a semiconductor device of a third embodiment.

Next, a semiconductor device according to a third embodiment of the present invention will be described with reference to FIG. 14 to FIG. 18. FIG. 14 is a plane view showing a lead frame used in the semiconductor device of the third embodiment. FIG. 15 to FIG. 18 are views showing the semiconductor device of the third embodiment, FIG. 15 being a top view showing a state where semiconductor chips are mounted on the lead frame shown in FIG. 14, FIG. 16 being a bottom view showing the state where the semiconductor chips are mounted on the lead frame shown in FIG. 14, FIG. 17 being a cross-sectional view taken along A-A line in FIG. 15, and FIG. 18 being a cross-sectional view showing a state where the lead frame on which the semiconductor chips are mounted is resin-sealed.

The lead frame 41 shown in FIG. 14 includes an inner lead portion 42 which serves as a connection portion with the semiconductor chips and a first and a second outer lead portion 43, 44 which serve as external connection terminals. The first outer lead portion 43 has a plurality of outer leads (first outer leads) 43A. The second outer lead portion 44 has a plurality of outer leads (second outer leads) 44A. The inner lead portion 42 has first inner leads 45 connected to the first outer leads 43A and second inner leads 46 connected to the second outer leads 44A.

The lead frame 41 has a first surface (upper surface) 41a and a second surface (lower surface) 41b. The lead frame 41 is a lead frame for double-sided mounting on whose upper and lower surfaces 41a, 41b the semiconductor chips are mounted. In the first surface 41a of the lead frame 41, a first chip mounting area X1 is set, and in the second surface 41b, a second chip mounting area X2 is set. On each of the first and second surfaces 41a, 41b of the lead frame 41, at least one semiconductor chip is mounted. The semiconductor chip disposed on the first surface 41a forms a first semiconductor chip group, and the semiconductor chip disposed on the second surface 41b forms a second semiconductor chip group.

Figure 15:
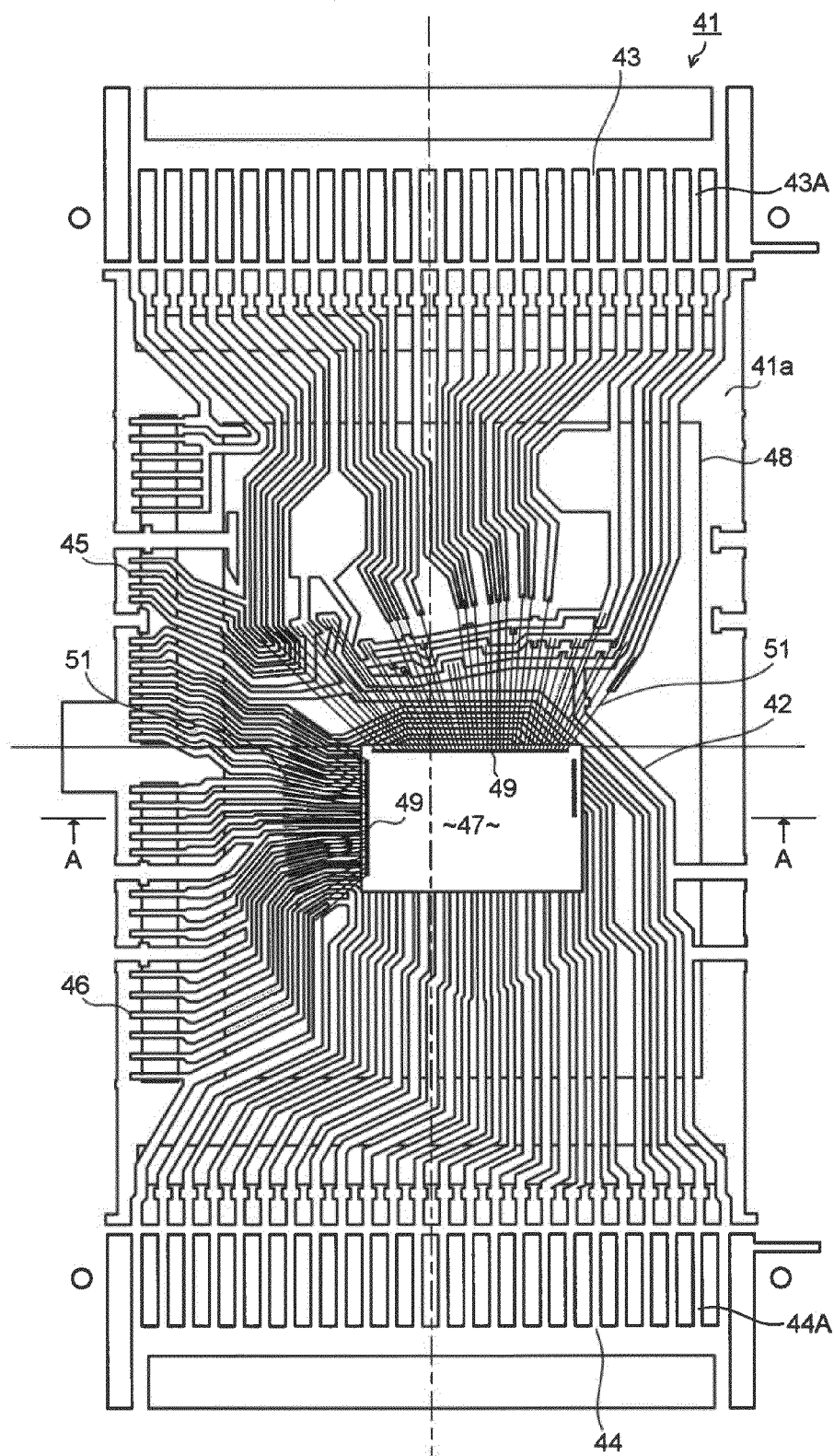
FIG. 15 is a top view showing a state where semiconductor chips are mounted on the lead frame shown in FIG. 14.
Figure 16:
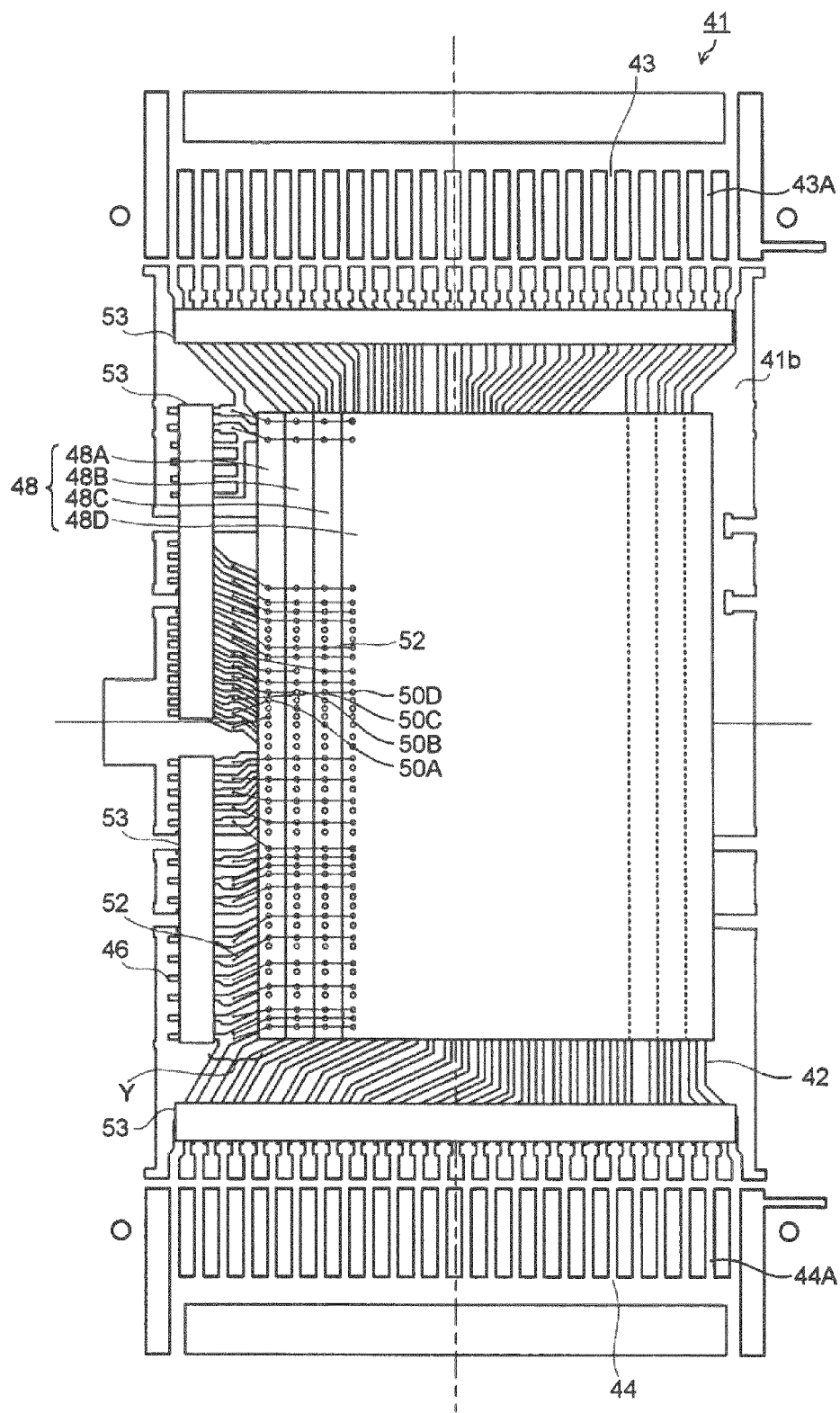
FIG. 16 is a bottom view of FIG. 15.
Figure 17:
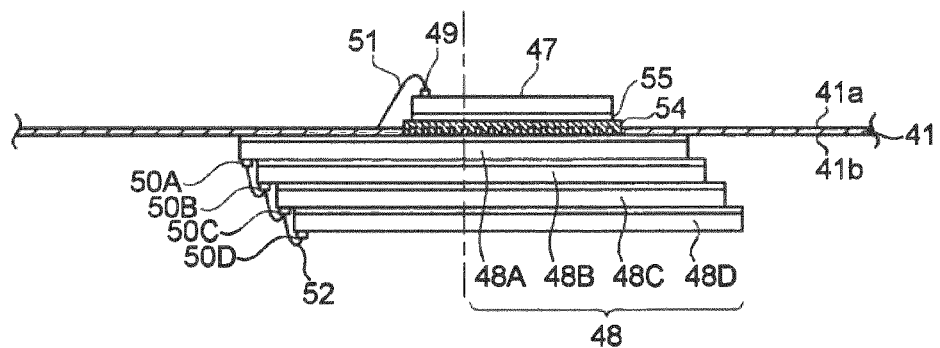
FIG. 17 is a cross-sectional view taken along A-A line in FIG. 15.
Figure 18:
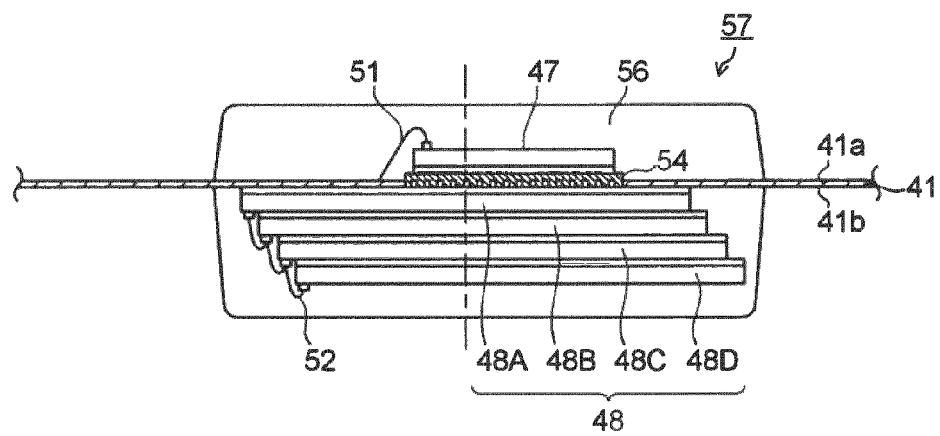
FIG. 18 is a cross-sectional view showing the semiconductor device (after molding) of the third embodiment.

As shown in FIG. 15 to FIG. 17, a small first semiconductor chip 47 is mounted on the first surface 41a of the lead frame 41. The first semiconductor chip 47 is disposed on the first chip mounting area X1 whose shape corresponds to the shape of the first semiconductor chip 47. Second semiconductor chips 48 (48A to 48D) larger in shape (outer shape) than the first semiconductor chip 47 are mounted on the second surface 41b of the lead frame 41. The four semiconductor chips 48A, 48B, 48C, 48D are stacked. The shape of the second chip mounting area X2 corresponds to the shape of the lowest semiconductor chip 48A. The semiconductor chip 48A is disposed on the second chip mounting area X2. The semiconductor chips 48B to 48D are stacked in order on the semiconductor chip 48A in a stepped manner.

A possible concrete example of the second semiconductor chips 48A to 48D is a semiconductor memory chip (memory device) such as a NAND flash memory. A possible concrete example of the first semiconductor chip 47 is a controller chip (controller device) of the NAND flash memories. The number of the stacked semiconductor chips 48 in the second semiconductor chip group is not limited to four, but may be two to three, or five or more. The semiconductor device including the semiconductor memory chips (second semiconductor chips 48) and the controller chip (first semiconductor chip 47) thereof form a semiconductor storage device.

The lead frame 41 is formed so as to be adaptable to the large second semiconductor chips 48 mounted on the second surface 41b and has a shape based on the outer shape of the second semiconductor chips 48. Since the first semiconductor 47 is smaller than the second semiconductor chips 48, the first chip mounting area X1 is located on an inner side of the second chip mounting area X2. The lead frame 41 has a chip mounting area X adaptable to a plane shape of the second semiconductor chips 48A to 48D (a plane-direction projected shape of the semiconductor chips 48A to 48D stacked in the stepped manner). The inner lead portion 42 and the outer lead portions 43, 44 are arranged with the chip mounting area X serving as a guideline.

The first outer lead portion 43 is disposed along one shorter side of the chip mounting area X. The second outer lead portion 44 is disposed along the other shorter side of the chip mounting area X. The first outer lead portion 43 and the second outer lead portion 44 are disposed to face each other via the chip mounting area X. The first and second outer lead portions 43, 44 are disposed so that the outer leads 43A, 44A project from both sides of a resin sealed body of the semiconductor device (semiconductor package) formed by using the lead frame 41.

The first semiconductor chip 47 has a rectangular outer shape and has electrode pads 49 arranged along its one longer side and one shorter side. The first semiconductor chip 47 is disposed so that its shorter sides become parallel to longer sides of the chip mounting area X. To enable the wire-bonding of the electrode pads 49 of the first semiconductor chip 47 and the inner lead portion 42, at least part of the inner lead portion 42 (at least part of the first and second inner leads 45, 46) needs to be disposed near the electrode pads 49 of the first semiconductor chip 47. The first chip mounting area X1 is smaller than the chip mounting area X and is set on an inner side of the chip mounting area X, and therefore, at least part of the inner lead portion 42 needs to be disposed in the chip mounting area X.

The second semiconductor chips 48 (48 to 48D) have rectangular outer shapes and have electrode pads 50 (50A to 50D) arranged along their longer sides on one side. To enable the wire-bonding of the electrode pads 50 of the second semiconductor chips 48 and the inner lead portion 42, part of the inner lead portion 42 needs to be disposed near the electrode pads 50 of the second semiconductor chips 48. The second chip mounting area X2 has substantially the same shape as that of the chip mounting area X. A part of the inner lead portion 42 needs to be disposed in a connection area Y with the second semiconductor chips 48 which area Y is disposed along the one longer side of the chip mounting area X.

The first inner leads 45 have one ends connected to the first outer leads 43A and the other ends disposed in the chip mounting area X. The ends of some inner leads 45 are disposed near the first chip mounting area X1 so as to be connectable to the first semiconductor chip 47. The ends of some other inner leads 45 are disposed in the connection area Y so as to be connectable to the second semiconductor chips 48. The first inner leads 45 extend from the first outer lead portion 43 and are routed inside the chip mounting area X so as to reach the vicinity of the first chip mounting area X1 or the connection area Y with the second semiconductor chips 48.

The second inner leads 46 have one ends connected to the second outer leads 44A and the other ends disposed in the chip mounting area X. The other ends of the second inner leads 46 are disposed in the connection area Y so as to be connectable to the second semiconductor chips 48. The second inner leads 46 reach the connection area Y with the second semiconductor chips 48 after passing through the vicinity of the first chip mounting area X1, so as to be connectable to the first semiconductor chip 47. The second inner leads 46 are routed inside the chip mounting area X so as to reach the connection area Y with the second semiconductor chips 48 after passing through the vicinity of the first chip mounting area X1.

The first semiconductor chip 47 is bonded on the first chip mounting area X1 of the lead frame 41. The electrode pads 49 of the first semiconductor chip 47 are electrically connected to the first and second inner leads 45, 46 via first metal wires 51. The first metal wires 51 are connected to front surfaces of the inner leads 45, 46 (upper surface 41a). A part of the electrode pads 49 are connected to the first outer leads 43A via metal wires 51 and the first inner leads 45. A part of the electrode pads 49 are connected to the second outer leads 44A via the first metal wires 51 and the second inner leads 46.

The second semiconductor chips 48A to 48D are stacked on the second chip mounting area X2 of the lead frame 41, and are disposed so that the electrode pads 50A to 50D are located along the one longer side of the chip mounting area X. The lowest semiconductor chip 48A is bonded on the second chip mounting area X2. The semiconductor chips 48A to 48D are stacked in order on the semiconductor chip 48A in a stepped manner, each of them being stacked so that the electrode pads 50 of the semiconductor chip 48 on the lower side thereof are exposed. The semiconductor chips 48A to 48D are each bonded on the semiconductor chip 48 on the lower side thereof.

The electrode pads 50A to 50D of the second semiconductor chips 48A to 48D are electrically connected to the first and second inner leads 45, 46 via second metal wires 52. The second metal wires 52 are connected to the rear surfaces of the inner leads 45, 46 (lower surface 41b). The electrode pads 50A to 50D of the second semiconductor chips 48A to 48D are electrically connected to the electrode pads 49 of the first semiconductor chip 47 via the first and second inner leads 45, 46. The electrode pads 50A to 50D are connected to the outer leads 43A, 44A via the first semiconductor chip 47, or not via the first semiconductor chip 47.

Regarding the connection of the electrode pads 50A to 50D of the semiconductor chips 48A to 48D, when their electric characteristics and signal characteristics are the same, the sequential connection of the electrode pads 50A to 50D by the second metal wires 52 is possible. That is, the electrode pads 50A to 50D of the semiconductor chips 58A to 58D are connected to one another by the metal wires 52 in sequence, and the electrode pads 50A of the semiconductor chip 48A and the inner leads 45, 46 are connected by the metal wires 52. A part of the electrode pads 50A to 50D are connected individually to the inner leads 45, 46.

As described above, the inner lead portion 42 is routed inside the chip mounting area X. Therefore, it possible to lead one ends of the inner leads 45, 46 to the vicinity of the small semiconductor chip 47. Even when the small semiconductor chip 47 is mounted on the upper surface 41a of the lead frame 41 which is formed based on the shape of the large semiconductor chips 48, it is possible to connect the electrode pads 49 of the semiconductor chip 47 and the inner leads 45, 46 via the metal wires 51 in a good condition. It is possible to form a semiconductor device by mounting the semiconductor chips 47, 48 having different outer shapes on the upper and lower surfaces 41a, 41b of the lead frame 41.

Further, a part of the inner leads 45, 46 are routed so as to reach the connection area Y with the second semiconductor chip 48 via the vicinity of the first chip mounting area X1. The use of such inner leads 45, 46 enables the electric connection between the first semiconductor chip 47 and the second semiconductor chips 48. Therefore, it is possible to electrically connect the small semiconductor chip 47 mounted on the upper surface 41a of the lead frame 41 and the large semiconductor chips 48 mounted on the lower surface 41b without using a relay substrate. This means that a package structure using the lead frame 41 can be employed without using the relay substrate even when the connection between the semiconductor chips 47, 48 is relatively complicated.

According to the third embodiment, it is possible to provide a semiconductor device in which the package structure using the lead frame 41 is adopted, and even more, the plural semiconductor chips 47, 48 having different outer shapes are mounted on the upper and lower surfaces 41a, 41b of the lead frame 41 and the plural semiconductor chips 47, 48 are electrically connected. Even in an electric circuit in which the connection between the semiconductor chips 47, 48 and the connection between the semiconductor chips 47, 48 and external terminals (the outer lead portions 43, 44 of the lead frame 41) are relatively complicated, these connections can be enabled by the inner leads 45, 46 and the metal wires 51, 52. Therefore, it is possible to realize a semiconductor device having various kinds of stack structures and connection structures, with the package using the lead frame 41.

In the lead frame 41 of the third embodiment, the way the inner lead portion 42 is routed is simpler than that of the first embodiment. The inner lead portion 42 is routed inside the chip mounting area X, and a part of the inner leads 45, 46 are sandwiched between the first semiconductor chip 47 and the second semiconductor chips 48, but gaps between the inner leads 46 are filled with insulating resin by using adhesive resin (insulating resin) of the first semiconductor chip 47 as will be described later. Therefore, the inner leads 45, 46 are fixed by an insulating tape 53 as in the second embodiment. This can enhance wire bondability and so on at low cost. The insulating tape 53 is stuck on the second surface 41b of the lead frame 41.

As described above, part of the inner lead portion 42 (a part of the second inner leads 46) is sandwiched by the first semiconductor chip 47 and the second semiconductor chips 48. Gap potions between the inner leads 46 located in an area where the first semiconductor chip 47 and the second semiconductor chips 48 overlap with each other (first chip mounting area X1) cannot be sufficiently filled only with sealing resin. Therefore, in the third embodiment, insulating resin 54 is filled in advance in the gaps between the inner leads 46 located in the first chip mounting area X1.

In the third embodiment, by using the adhesive resin (insulating resin) of the first semiconductor chip 47, the insulating resin 54 is filled in the gaps between the inner leads 46. That is, the first chip mounting area X1 of the lead frame 41 is coated with insulative adhesive paste (insulating resin paste). For bonding, the first semiconductor chip 47 is pressed against a coating layer of the adhesive paste. At this time, the adhesive paste enters the gaps between the inner leads 46. Consequently, the insulating resin 54 is filled in the gaps between the inner leads 46.

The adhesive paste functioning as the adhesive layer of the first semiconductor chip 47 and the insulating resin 54 is applied in consideration of an amount filled in the gaps between the inner leads 46. The application of the adhesive paste in an insufficient amount may possibly cause the contact between the first semiconductor chip 47 and the lead frame 41. On the rear surface (bonding surface) of the first semiconductor chip 47, an insulating layer 55 is provided in order to prevent the first semiconductor chip 47 from coming into contact with the lead frame 41 when an amount of the adhesive paste applied is insufficient. The insulating layer 55 is formed by sticking an insulating film on the rear surface of the first semiconductor chip 47.

Since the insulating resin 54 is filled in the gap portions between the inner leads 45, 46 located in the area where the first semiconductor chip 47 and the second semiconductor chips 48 overlap with each other, the gaps between the inner leads 45, 46 do not remain as space even when the semiconductor chips 47, 48 are mounted on the both surfaces (first and second surfaces 41a, 41b) of the lead frame 41. This can prevent the occurrence of a short circuit and the like ascribable to the entrance of moisture absorbed in the semiconductor package into the gaps between the inner leads 45, 46. That is, it is possible to provide a highly reliable semiconductor package having a double-sided mounting structure.

The first semiconductor chip 47 mounted on the upper surface 41a of the lead frame 41 and the second semiconductor chips 48 mounted on the lower surface 41b are sealed by a resin sealing portion 56 together with the inner lead portion 42 and the metal wires 51, 52. They form a semiconductor device 57 having the double-sided mounting structure. In the semiconductor device 57, the finally cut lead frame 41 forms a circuit base. The circuit base includes the inner lead portion 42, the outer lead portions 43, 44, and the chip mounting area X. The semiconductor device 57 of the third embodiment is suitable as a large-capacity, high-function semiconductor storage device similarly to that of the first embodiment.

According to the semiconductor device 57 of the third embodiment, based on the structure, shape, and so on of the inner lead portion 42, the semiconductor chips 47, 48 which are mounted on the upper and lower surfaces 41a, 41b of the lead frame 41, in particular, the semiconductor chip 47 smaller than the semiconductor chips 48 can be easily connected to the lead frame 41, and the semiconductor chips 47, 48 can be electrically connected to each other easily. Further, the insulating resin 54 filled in parts of the gaps between the inner leads 45, 46 can prevent the occurrence of a short circuit and the like ascribable to the gap portions (space) between the inner leads 45, 46. Therefore, it is possible to provide the semiconductor device 57 in which capability of mounting the semiconductor chips 47, 48 having various kinds of shapes, connectability, reliability, and so on are improved.

The present invention is not limited to the above-described embodiments but is applicable to a lead frame on whose front and rear surfaces semiconductor chips are mounted and to a semiconductor device with a double-sided mounting structure using the lead frame. The semiconductor device of the present invention is not limited to a semiconductor storage device and is applicable to a semiconductor device including semiconductor chips (in particular, semiconductor chips having different outer shapes) which are mounted on upper and lower surfaces of a lead frame. Such a semiconductor device is also included in the present invention. The embodiments of the present invention can be expanded or modified within a range of a technical spirit of the present invention, and the expanded and modified embodiments are also included in the technical scope of the present invention.

What is claimed is:

1. A semiconductor device, comprising:
a circuit base including a chip mounting area, a first external terminal portion including first external terminals, a second external terminal portion including second external terminals opposed to the first external terminals via the chip mounting area, and an inner lead portion having first inner leads connected to the first external terminals, second inner leads connected to the second external terminals and third inner leads electrically independent of the first and second external terminals, at least part of the first, second, and third inner leads being routed inside the chip mounting area;

a first semiconductor chip group, disposed on the chip mounting area in a first surface of the circuit base, including at least one first semiconductor chip having first electrode pads;

a second semiconductor chip group, disposed on the chip mounting area in a second surface of the circuit base, including at least one second semiconductor chip having second electrode pads;

first metal wires electrically connecting the first electrode pads of the first semiconductor chip and the inner lead portion;

second metal wires electrically connecting the second electrode pads of the second semiconductor chip and the inner lead portion; and a resin sealing portion sealing the first and second semiconductor chip groups together with the first and second metal wires, wherein at least part of the first electrode pads of the first semiconductor chip are electrically connected to the second electrode pads of the second semiconductor chip via the third inner leads.

2. The semiconductor device according to claim 1, wherein the second semiconductor chip is larger in outer shape than the first semiconductor chip.

3. The semiconductor device according to claim 1, further comprising, an insulating resin filled in a gap between at least part of the first, second, and third inner leads located in the chip mounting area.

4. The semiconductor device according to claim 2, wherein at least part of the third inner leads are routed inside the chip mounting area so that one ends of the third inner leads are located near the first semiconductor chip and other ends of the third inner leads are located in a connection area with the second semiconductor chip.

5. The semiconductor device according to claim 2, wherein at least part of the third inner leads are routed inside a first area in the chip mounting area, and the first semiconductor chip is mounted on the third inner leads located in the first area.

6. The semiconductor device according to claim 5, wherein an insulating resin is filled in a gap between the third inner leads located in the first area.

7. The semiconductor device according to claim 2, wherein the first semiconductor chip is mounted on an island portion provided in the chip mounting area.

8. The semiconductor device according to claim 2, wherein the first semiconductor chip is mounted on the second semiconductor chip via an opening portion provided in the chip mounting area.

9. The semiconductor device according to claim 1, wherein the second semiconductor chip group includes a plurality of second semiconductor chips stacked in a stepped manner so as to expose the second pads.

10. The semiconductor device according to claim 1, wherein the second semiconductor chip group includes a memory device as the second semiconductor chip, and the first semiconductor chip group includes, as the first semiconductor chip, a controller device of the memory device.

* * * * *